(12) United States Patent
Idreos et al.

(10) Patent No.: US 11,397,712 B2
(45) Date of Patent: Jul. 26, 2022

(54) RAPID AND ROBUST PREDICATE EVALUATION

(71) Applicant: PRESIDENT AND FELLOWS OF HARVARD COLLEGE, Cambridge, MA (US)

(72) Inventors: Stratos Idreos, Cambridge, MA (US); Brian Hentschel, Cambridge, MA (US); Michael Kester, Cambridge, MA (US)

(73) Assignee: PRESIDENT AND FELLOWS OF HARVARD COLLEGE, Cambridge, MA (US)

( * ) Notice: Subject to any disclaimer, the term of this patent is extended or adjusted under 35 U.S.C. 154(b) by 32 days.

(21) Appl. No.: 17/051,797

(22) PCT Filed: Apr. 22, 2019

(86) PCT No.: PCT/US2019/028444
§ 371 (c)(1),
(2) Date: Oct. 30, 2020

(87) PCT Pub. No.: WO2019/212781
PCT Pub. Date: Nov. 7, 2019

(65) Prior Publication Data
US 2021/0365422 A1 Nov. 25, 2021

Related U.S. Application Data

(60) Provisional application No. 62/665,075, filed on May 1, 2018.

(51) Int. Cl.
*G06F 16/21* (2019.01)
*G06F 16/22* (2019.01)
(Continued)

(52) U.S. Cl.
CPC .......... *G06F 16/217* (2019.01); *G06F 16/221* (2019.01); *G06F 16/2255* (2019.01);
(Continued)

(58) Field of Classification Search
CPC .. G06F 16/217; G06F 16/221; G06F 16/2255; G06F 16/2264; G06F 16/242; G06F 16/285; G06F 16/22; H03M 7/3062
See application file for complete search history.

(56) References Cited

U.S. PATENT DOCUMENTS

| 8,972,337 B1 | 3/2015 | Gupta |
| 2003/0065652 A1 | 4/2003 | Spacey |

(Continued)

OTHER PUBLICATIONS

3) J. Goldstein, R. Ramakrishnan and U. Shaft, "Compressing relations and indexes," Proceedings 14th International Conference on Data Engineering, 1998, pp. 370-379, doi: 10.1109/ICDE.1998.655800. (Year: 1998).*

(Continued)

*Primary Examiner* — Apu M Mofiz
*Assistant Examiner* — Oscar Wehovz
(74) *Attorney, Agent, or Firm* — Morgan, Lewis & Bockius, LLP

(57) ABSTRACT

Various approaches for accelerating data access to a computer memory and predicate evaluation includes storing, in the computer memory, (i) base data as multiple base columns, (ii) multiple sketched columns each corresponding to a base column in the base data and having smaller code values compared thereto, and (iii) a compression map for mapping one or more base columns to the corresponding sketched column; applying the compression map to a query having a predicate; determining data on the sketched column that satisfies the predicate; and evaluating the predicate
(Continued)

based at least in part on the determined data on the sketched column without accessing the base column in the base data.

20 Claims, 14 Drawing Sheets

(51) Int. Cl.
*G06F 16/242* (2019.01)
*G06F 16/28* (2019.01)
*H03M 7/30* (2006.01)

(52) U.S. Cl.
CPC ........ *G06F 16/2264* (2019.01); *G06F 16/242* (2019.01); *G06F 16/285* (2019.01); *H03M 7/3062* (2013.01)

(56) References Cited

U.S. PATENT DOCUMENTS

| | | | |
|---|---|---|---|
| 2006/0170571 A1* | 8/2006 | Martinian | H03M 7/30 341/50 |
| 2009/0006399 A1* | 1/2009 | Raman | G06F 16/2456 |
| 2009/0254532 A1 | 10/2009 | Yang et al. | |
| 2010/0082545 A1 | 4/2010 | Bhattacharjee et al. | |
| 2010/0088315 A1* | 4/2010 | Netz | G06F 16/221 707/737 |
| 2016/0147904 A1 | 5/2016 | Wein et al. | |
| 2016/0179858 A1* | 6/2016 | Finlay | G06F 16/2282 707/693 |

OTHER PUBLICATIONS

International Search Report and Written Opinion issued in a corresponding International Application No. PCT/US2019/028444, dated Jul. 17, 2019, 10 pages.

* cited by examiner

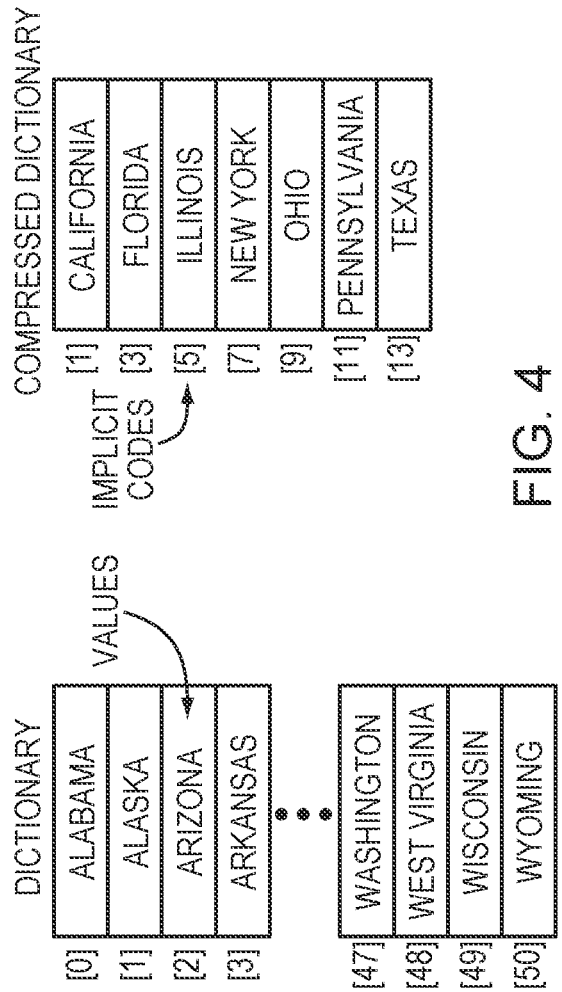
FIG. 4
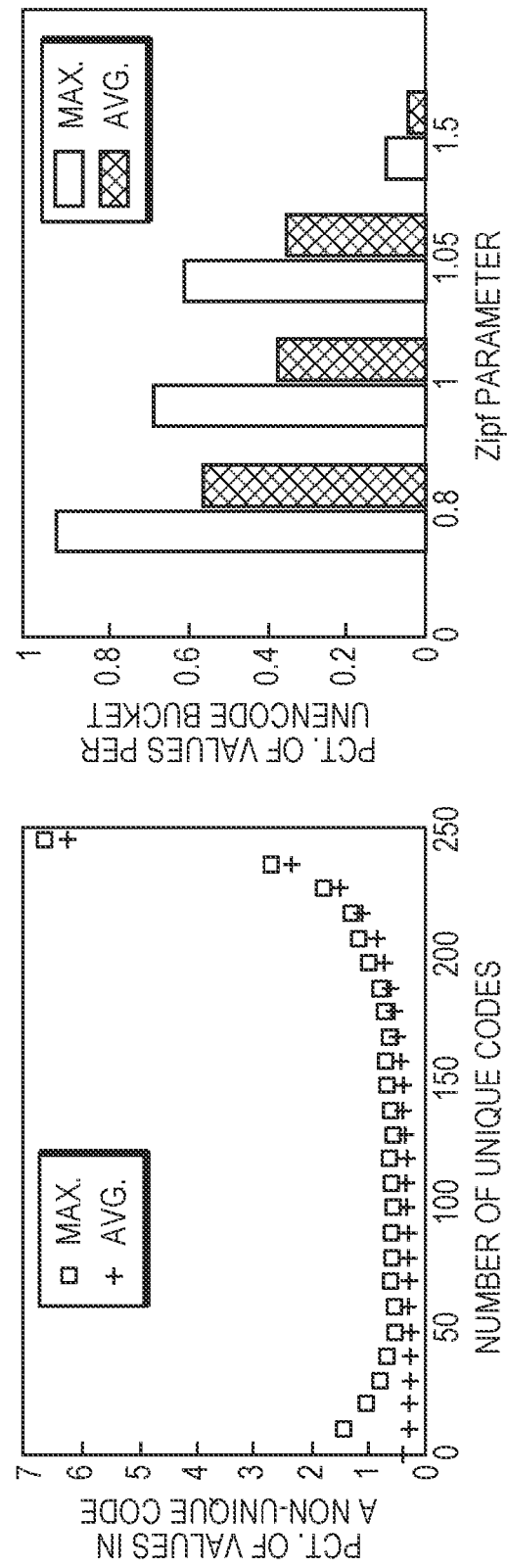
FIG. 6
FIG. 5

---
ALGORITHM 2 COLUMN SKETCHES SCAN
SELECT WHERE B < x, COLUMN SKETCH OF ONE BYTE VALUES
---
Require: S is a function which is order preserving
1:   repeat_sx = _mm128_set1_epi8(S(x))
2:   for each segment b in sketched column do
3:       /*Work over the code one block of data at a time */
4:       position= b x segment size
5:       for number of simd iterations in segment size do
6:           /*Perform logical comparisons necessary for predicate evaluation on each code. The 1,2 denote that this is done twice */
7:           codes1,2 = _mm_load_si128(codes_address)
8:           definite1,2 =_mm_cmplt_epi8(codes,repeat_sx)
9:           possible1,2 = _mm_cmpeq_epi8(codes,repeat_sx)
10:          bitvector_def1,2 = _mm128_movemask_epi8(definite1)
11:          bitvector_possible1,2 = _mm128_movemask_epi8(possible1)
12:          /*Store results we are certain of*/
13:          bitvector_def = (bitvector_def1 « 16) | bitvector_def2
14:          store(bitvector_def) into result
15:          /*Check if the boundary values have any matching tuples and store qualifying positions. */
16:          conditional store bitvector_possible1,2 into temp_result.
17:          position += 32
18:      /*Check all tuples that we are uncertain about */
19:      for position in temp_result do
20:          if B[position] == x then
21:              set bit position + beginning position in result

FIG. 7

| BETA | BITWEAVING (cycles/code) | COLUMN SKETCH (cycles/code) |
|---|---|---|
| 1 (UNIFORM) | 0.092 | 0.066 |
| 5 | 0.112 | 0.066 |
| 10 | 0.118 | 0.066 |
| 50 | 0.139 | 0.066 |
| 500 | 0.152 | 0.066 |
| 5000 | 0.188 | 0.066 |

FIG. 15

RAPID AND ROBUST PREDICATE EVALUATION

CROSS-REFERENCE TO RELATED APPLICATION

This application is a U.S. National Phase Application of PCT/US2019/028444, filed Apr. 22, 2019, which claims priority to, and the benefits of, U.S. Provisional Patent Application No. 62/665,075, filed on May 1, 2018, the entire disclosure of which is hereby incorporated by reference.

FIELD OF THE INVENTION

The field of the invention relates, generally, to predicate evaluation and, more particularly, to approaches that accelerate data access and predicate evaluation.

BACKGROUND

Base data access and methods for predicate evaluation are of central importance to analytical database performance. Indeed, as every query requires either an index or table scan, the performance of the scan operator acts as a baseline for system performance. Myriad methods and optimizations have been proposed for enhancing scan performance. Each of the existing access methods, however, performs suboptimally in certain situations. FIG. 1 depicts an example where different classes of access methods from indexing to scan accelerators such as Zone Maps and BitWeaving fail to bring any improvement over a plain scan.

Long a staple of database systems, traditional secondary indices such as B-trees localize data access to tuples of interest, and thus provide excellent performance for queries that contain a low selectivity predicate. But changes in the storage layout from row-oriented to column-oriented and increasing memory capacities have improved the performance of scans relative to traditional indices. Currently, scans outperform B-trees for query selectivities as low as 1%.

Moreover, B-trees suffer from several inherent shortcomings. First, traditional indices look at the data in the order of the domain, not in the order of the table. Thus, their output leaves a choice between sorting the output of the index by the order of the table or continuing through the rest of the query execution plan looking at values out of order. Second, sorted-order indices require gaps, in the form of non-full leaf nodes for B-trees, for new insertions in order to amortize update costs. These gaps then require jumping around in memory during predicate evaluation, thereby continually interrupting the processor as data is retrieved. Both of these contrast with the modern scan, which relies on comparisons in tight iterative loops over contiguous data in memory, and which looks at data in the order of the table. Finally, traditional indices have updates scattered throughout their domain and thus do not interact very well with the append-only file systems that many analytic databases run on today. As depicted in FIG. 1, the performance of the B-tree is notably worse than the other methods for a select predicate with very low selectivity at 3%.

Some conventional lightweight indexing techniques have made an impact on scan performance by, for example, skipping data while doing an in-order scan. Zone Maps are amongst the most widely used techniques; they work by storing small amounts of metadata, such as min and max, for large blocks of data. This small amount of metadata exploits natural clustering properties in data and allows scans to skip over blocks that either entirely qualify or entirely do not qualify. Other techniques, such as Column Imprints or Feature Based Data Skipping, take more sophisticated approaches, but the high level idea is the same: they use summary statistics over groups of data to enable data-skipping. While useful in the right circumstances, the approach of using summary statistics over groups of data provides no help in the general case where data does not exhibit clustering properties. FIG. 1 depicts such a case, where the column's values are independent of their positions; then, Zone Maps bring no advantage and the scan performance with and without Zone Maps is the same.

In addition, early pruning methods, such as Byte-Slicing, Bit-Slicing, and Approximate and Refine techniques work by bitwise-decomposing both data elements and predicates. On a physical level, this means partitioning single values into multiple sub-values, either along each bit, each byte, or along arbitrary boundaries. After physically partitioning the data, each technique takes a predicate over the value and decomposes the predicate into conjunctions of disjoint sub-predicates. As an example, checking whether a two-byte numeric value equals 100 is equivalent to checking if the high order byte is equal to 0 and the lower order byte is equal to 100. After decomposing the predicate into disjoint parts, each technique evaluates the predicates in order of highest order bit(s) to lowest order bit(s), and skips predicate evaluation for predicates later in the evaluation order if groups of tuples in some block are all certain to have qualified or not qualified. Substantial amounts of data are thus skipped if the data in the high order bytes is informative. These techniques, however, can suffer under data skew. For example, using the example described above, if a significant portion of high order bytes have value 0 then the predicate over the first byte is largely uninformative and the predicate over the second order byte almost always has to be evaluated. This is captured in FIG. 1. The high order bits, which are biased towards zero, provide little pruning and the performance of early pruning techniques provide no significant advantage over a traditional scan.

Accordingly, there is a need for an approach that not only accelerates scans and improve performance regardless of selectivity, data-value distribution and data clustering but also creates informative bit representations while keeping memory overhead low.

SUMMARY

The present invention provides a "column sketch" as a new class of indexing scheme for improving the performance of scan predicate evaluation, independently of selectivity, data-value distribution, and data-clustering. In various embodiments, the column sketch includes a compression map that applies lossy compression on a value-by-value basis and maps values of a column in the base data to smaller fixed-width code values in an auxiliary sketched column. The compressive mapping preserves properties (e.g., ordering) of the data and allows evaluation of the predicates to be primarily in the auxiliary column. In this way, less data in the base data is accessed compared with conventional approaches that scan the large base column. Accordingly, the column sketch may advantageously improve CPU efficiency, reduce data movement, and improve scan performance. In addition, the column sketch may evaluate a query predicate for the vast majority of values using the small auxiliary sketched column, and only check the base column for the remaining values; this approach thus significantly accelerates the predicate evaluation.

Accordingly, in one aspect, the invention pertains to an apparatus for accelerating data access and predicate evaluation. In various embodiments, the apparatus includes a computer memory for storing (i) base data as multiple base columns, (ii) multiple sketched columns, each corresponding to a base column in the base data and having smaller code values compared thereto, and (iii) a compression map for mapping one or more base columns to the corresponding sketched column(s); and a computer processor configured to apply the compression map to a query having a predicate; determine data on the sketched column that satisfies the predicate; and evaluate the predicate based at least in part on the determined data on the sketched column without accessing the base column in the base data. In one implementation, the sketched column has a fixed width.

The computer processor may be further configured to determine one or more values whose appearance in the base column is above a predetermined threshold; apply the compression map to assign one or more unique codes to the value(s); and associate the unique code(s) with the sketched column(s). In one embodiment, the compression map includes an array of sorted values and/or a hash table having the unique code(s) and a hash function. For example, the compression map may include the array of sorted values when the compression map is order-preserving. Alternatively, the compression map may include the hash table when the compression map is non-order preserving.

In addition, the computer processor may be further configured to implement lossy compression for constructing the compression map. In some embodiments, the computer processor is further configured to construct multiple contiguous histogram buckets having equi-depth histograms that approximate a common data format of the base data, and create the sketched columns based at least in part on the histogram buckets. In addition, the computer processor may be further configured to construct the histogram buckets by sampling values uniformly from the base columns, generating a sorted list of the sampled values, and generating endpoints of each histogram bucket based on the sorted list. In one implementation, the computer processor is further configured to (i) determine one or more frequent values based at least in part on a number of the endpoints and values in the base data and (ii) assign one or more unique codes to the frequent value(s). In one embodiment, the base data includes categorical data; the computer processor is then further configured to encode the categorical data using lossy dictionary encoding. The computer processor may be further configured to assign a numerical code to each unique value in the base column; and determine whether the numerical codes have appearance in the base column above a predetermined threshold, and, if not, collapse at least some of the numerical codes into a single code.

In another aspect, the invention relates to a method of accelerating data access to a computer memory and predicate evaluation. In various embodiments, the method includes storing, in the computer memory, (i) base data as multiple base columns, (ii) multiple sketched columns, each corresponding to a base column in the base data and having smaller code values compared thereto, and (iii) a compression map for mapping one or more base columns to the corresponding sketched column(s); applying the compression map to a query having a predicate; determining data on the sketched column that satisfies the predicate; and evaluating the predicate based at least in part on the determined data on the sketched column without accessing the base column in the base data. In one implementation, the sketched column has a fixed width.

The method may further include determining one or more values whose appearance in the base column is above a predetermined threshold; applying the compression map to assign one or more unique codes to the value(s); and associating the unique code(s) with the sketched column(s). In one embodiment, the compression map includes an array of sorted values and/or a hash table having the unique code and a hash function. For example, the compression map may include the array of sorted values when the compression map is order-preserving. Alternatively, the compression map may include the hash table when the compression map is non-order preserving.

Additionally, the method may further include implementing lossy compression for constructing the compression map. In some embodiments, the method further includes constructing multiple contiguous histogram buckets having equi-depth histograms that approximate a common data format of the base data, and creating the sketched columns based at least in part on the histogram buckets. In addition, the histogram buckets may be constructed by sampling values uniformly from the base columns, generating a sorted list of the sampled values, and generating endpoints of each histogram bucket based on the sorted list. In one implementation, the method further includes determining one or more frequent values based at least in part on a number of the endpoints and values in the base data; and assigning one or more unique codes to the frequent value(s). In one embodiment, the base data includes categorical data; the method further includes encoding the categorical data using lossy dictionary encoding. The method may further include assigning a numerical code to each unique value in the base column; and determining whether the numerical codes have appearance in the base column above a predetermined threshold, and, if not, collapse at least some of the numerical codes into a single code.

Reference throughout this specification to "one example," "an example," "one embodiment," or "an embodiment" means that a particular feature, structure, or characteristic described in connection with the example is included in at least one example of the present technology. Thus, the occurrences of the phrases "in one example," "in an example," "one embodiment," or "an embodiment" in various places throughout this specification are not necessarily all referring to the same example. Furthermore, the particular features, structures, routines, steps, or characteristics may be combined in any suitable manner in one or more examples of the technology. The headings provided herein are for convenience only and are not intended to limit or interpret the scope or meaning of the claimed technology.

BRIEF DESCRIPTION OF THE DRAWINGS

In the drawings, like reference characters generally refer to the same parts throughout the different views. Also, the drawings are not necessarily to scale, with an emphasis instead generally being placed upon illustrating the principles of the invention. In the following description, various embodiments of the present invention are described with reference to the following drawings, in which:

FIG. 4 depicts a comparison of a regular dictionary encoding to an exemplary lossy dictionary encoding in accordance with various embodiments;

FIG. 5 depicts a preferred range of the number of unique codes in accordance with various embodiments;

FIG. 6 depicts the numbers of tuples in each non-unique code for datasets having a high or low skew in accordance with various embodiments;

FIG. 7 depicts an exemplary algorithm for a column-sketch scan in accordance with various embodiments;

FIG. 15 depicts the scan performance under skewed datasets for the column-sketch approach in accordance with various embodiments and conventional approaches;

DETAILED DESCRIPTION

Embodiments of the present invention provide an indexing technique, the column sketch, to achieve better scan performance regardless of data ordering, data distribution and query selectivity. As further described below, the column sketch generally includes one or more sketched columns, each corresponding to a base column in the base data, and a compression map for mapping the base column(s) to the corresponding sketched columns. Upon receiving a query having a predicate, the compression map may be applied to determine data in the sketched column that satisfies the predicate; based thereon, the predicate can be evaluated based on the sketched column without accessing the base column in the base data. As a result, the column sketch described herein may advantageously improve CPU efficiency, reduce data movement, and improve scan performance.

A. Column Sketches Overview

1) Base Data Format

Figure 1:
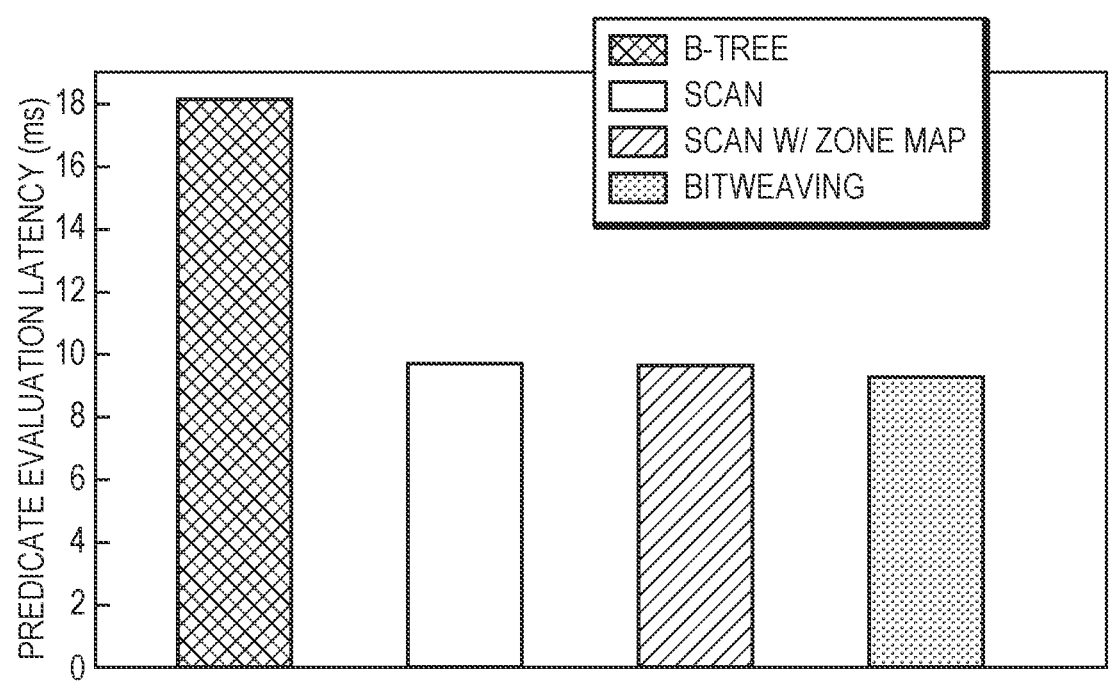
FIG. 1 depicts an example where conventional access approaches from indexing to scan accelerators fail to bring any improvement over a plain scan.
Figures 2A, 2B, 2C:
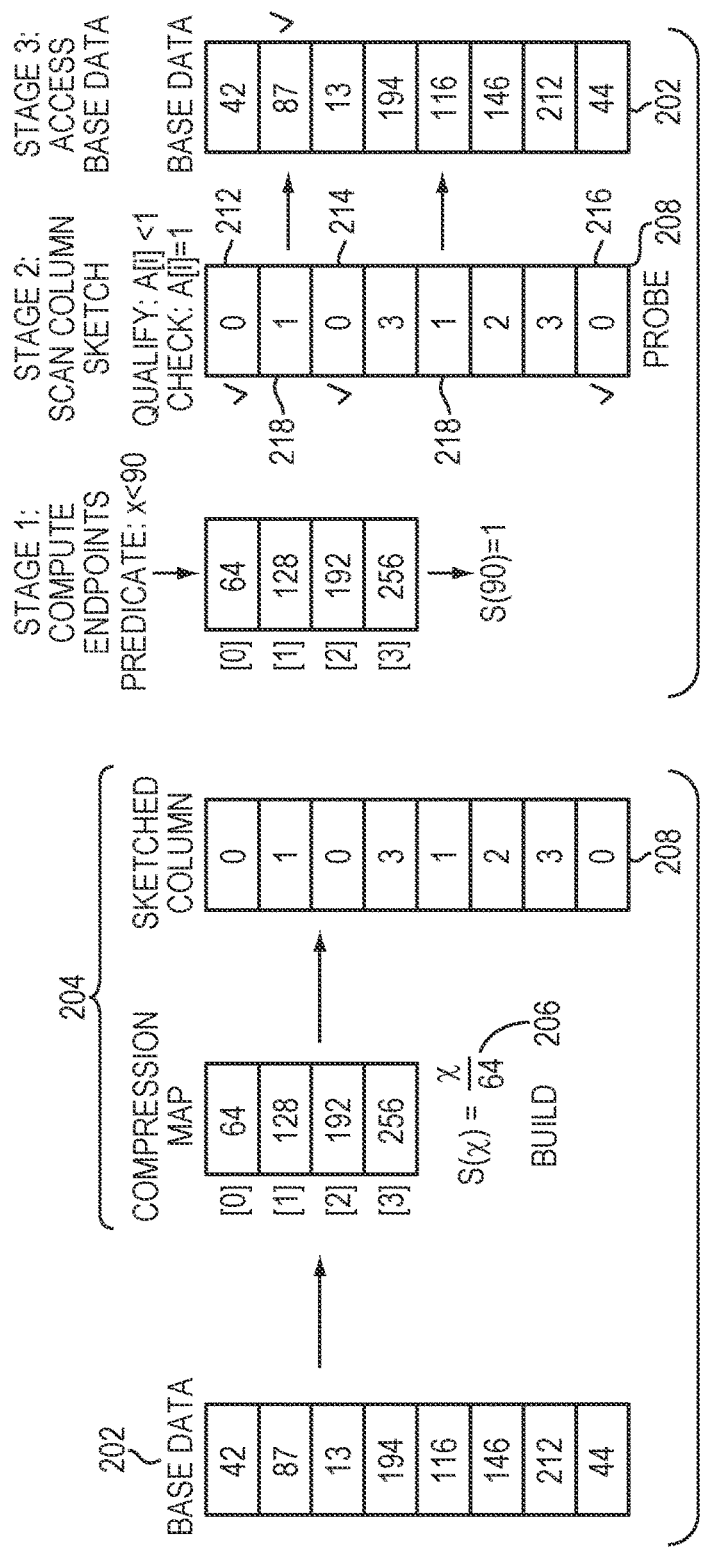
FIG. 2A depicts an exemplary column-sketch indexing scheme in accordance with various embodiments.
FIG. 2B depicts an exemplary approach for applying a compression map to transform values in the base data to smaller code values in a sketched column in accordance with various embodiments.
FIG. 2C depicts an exemplary algorithm for transforming values in the base data to smaller code values in a sketched column utilizing a compression map in accordance with various embodiments.

FIG. 2A depicts base data 202 and an exemplary scan column sketch 204 in accordance with various embodiments. In various embodiments, base data is required to produce a value B[i] for a base attribute B at a given position i. This enables the column sketch to work over row, column-group, or columnar data layouts (although the description herein focuses on the column sketches over columnar data layouts). In addition, all base columns of a table may be assumed to be positionally aligned; thus, positions may be used to identify values of the same tuple across columns. For numerical data types and dictionary encoded string data, the base data is an array of fixed-width values, with the value of position i at index i in the array. For unencoded variable length data, such as strings, there may be one level of indirection, with an array of offsets pointing into a blob data structure containing the values.

2) Column Sketch Format

As depicted in FIG. 2A, the column sketch 204 may include two structures: the first structure includes a compression map, S, 206 that may be a function denoted by S(x), and the second structure includes a sketched column 208. Thus, as used herein, the term "column sketch" 204 refers to the joint pairing of both the compression map 206 and the sketched column 208.

The compression map 206 may be stored in one of two formats. In one embodiment, the compression map is stored as an array of sorted values; this is suitable when S is order-preserving (and thus the resulting column sketch is also order-preserving). The value in the array at position i gives the last element included in code i. For example, if position (i−1) holds the value 1000 and position i holds the value 2400, then code i represents values between 1001 and 2400. Storing S in such a simple structure means that the code value for any incoming value in the base data can be quickly obtained. Generally, the efficiency of this lookup is not critical for analytical queries, as the time taken to scan the sketched column typically dominates the time taken to lookup the query endpoints in the compression map. Lookup performance, however, is more important for data ingestion as each incoming code needs to be transformed into its code value. In some embodiments, the function S includes a hash table having unique codes and a hash function as further described below; this is suitable for non-order preserving column sketches. In this format, frequent values may be given unique codes and stored in the hash table, while infrequent values may not have their codes stored and are instead computed as the output of a (separate) hash function.

In various embodiments, the sketched column is a fixed-width and dense array, with position i storing the output of the function S applied to the value at position i of the base data. FIG. 2A depicts an exemplary compression map 206, $S(x)=x/64$, for transforming the base data 202 to the sketched column 208. To differentiate between values in the base data 202 and the sketched column 208, the values in the base data 202 herein are referred to as simply values and the values in the sketched column 208 are referred to as codes or code values.

3) Example: Building and Querying a Column Sketch

FIG. 2A depicts transforming the 8 bit unsigned integers $I_8$ to the 2 bit unsigned integers $I_2$ using a function $S(x)=x/64$. S is order preserving and has the following properties:

(1) for x, $y \in I_8$, $S(x) \neq S(y) \Rightarrow x \neq y$
(2) for x, $y \in I_8$, $S(x) < S(y) \Rightarrow x < y$ In addition, S produces an output that is fixed-width (i.e., two bits in FIG. 2A) and assigns an equal number of values in the base data to each code. Thus, various embodiments utilize S to build a smaller sketched column from the original base column. For each position i in the base column B, S sets position i in the sketched column to be S(B[i]). As depicted in FIG. 2A, the sketched column 208 is ¼ the size of the original base column 202; scanning the sketched column 208 thus advantageously takes less data movement.

Further, as depicted in FIGS. 2B and 2C, consider the evaluation of a query with a predicate WHERE B<x as an example. Because S is order preserving, a column sketch can translate this predicate into (S(B)<S(x)) OR (S(B)=S(x) AND B<x). To evaluate this new predicate, the column sketch may first compute S(x) and then scan the sketched column S(B) and check both S(B)<S(x) and S(B)=S(x). For values less than S(x), their base value qualifies, and for values greater than S(x), their values in the base column do not qualify. For values equal to S(x), their base value may or may not qualify and thus it may be necessary to evaluate B<x using the base data. This process is depicted in FIG. 2B using an algorithm depicted in FIG. 2C.

As shown in FIG. 2B, positions 212-216 in the sketched column 208 qualify the predicate without the need of accessing the base data. Positions 218, 220, however, need to be checked in the base data, and of these two, only position 218 qualifies. Thus, the column-sketch approach described herein needs to go to the base data twice only while checking 8 values. This is explained by the small number of bits in the compressed code. In general, each code in the column sketch may have a relatively equal number of values, and so the base data is expected to be accessed once for every $2^{\#bits}$ values. When the code size is expanded to 8 or 16 bits, the column-sketch scan may need to check the base data only for one out of every $2^8$ or $2^{16}$ values, respectively.

The example depicted in FIGS. 2A and 2B provide the high level concept of the column-sketch approach for evaluating predicates in accordance with various embodiments of the present invention. They utilize a simple compression map and scan algorithm for ease of description. As further described below, the column sketch may include more logical concepts for efficiently delivering robust performance on scan predicate evaluation.

B. Constructing Compression Maps

1) Compression Map Objectives

In various embodiments, the compression map is defined as a function mapping the domain of the base data to the domain of the sketched column. The goal of the compression map is to limit the number of times the base data is accessed as well as to efficiently support data modifications. To achieve this, in various embodiments, the compression map assigns frequently "seen" values their own unique codes. As depicted in FIG. 2B, when checking the endpoint of a query, such as B<x, the column-sketch approach needs to check the base data when the code S(x) is observed. If x is a value that has its own code (i.e., $S^{-1}(S(x))=\{x\}$), then there is no need to check the base data and the query can be directly answered through only the column sketch. This property may hold for both range predicates and equality predicates.

To achieve robust scan performance, in some embodiments, the frequent values are identified and given their own unique code. This is because if there is a value that accounts for 10% of tuples and also has a non-unique code, predicates uncertain about this code value may need to access the base data a significant number of times; this may degrade performance, resulting in comparable performance of the column-sketch approach to the conventional scans. In addition, the compression map may assign non-unique codes similar numbers of values. This is because assigning to each non-unique code only a small portion of the data set bounds the number of base data accesses needed for any scan. Further, the compression map may preserve order when it is desired. Certain attributes may see range predicates whereas others do not. For attributes that see range predicates, the compression map may be order-preserving for efficiently evaluating range queries.

In some embodiments, the compression map handles unseen values in the domain without re-encoding. A prominent feature of the column sketch described herein is that it is easy to update. All insertions and updates only require a probe of a small dictionary. In addition, because the compression in the column sketch is lossy (as further described below), infinite domains may be represented with only a finite number of bits. Thus, the column sketch approach described herein may not need to re-encode new values in the base domain. For the ordered column sketches to have this property, there may not be consecutive unique codes. For example, if the compression map, S, assigns the unique codes i to "gale" and i+1 to "gate," some input strings, such as "game," may have no code value. Changing the code for "gate" to be non-unique may solve this problem. In one embodiment, every unseen value for the unordered column sketches has a possible value as long as there exists at least one non-unique code.

2) Bounding Base Data Accesses

In various embodiments, two theorems are held regarding how the number of values assigned to non-unique codes can be limited.

Theorem 1. Let X be any finite domain with elements $x_1$, $x_2, \ldots, x_n$ and order $x_1 < x_2 < \ldots < x_n$. Let each element $x_i$ have associated frequency $f_i$ with $\Sigma_{i=1}^n f_i = 1$. Let Y be a domain of size 256 and have elements $y_1, y_2, \ldots, y_{256}$. Then, there exists an order-preserving function S: $X \rightarrow Y$ such that for each element $y_i$ of Y, either $\Sigma_{x \in S^{-1}(y_i)} f(x) \leq 2/256$ or $S^{-1}(y_i)$ is a single element of X.

This theorem for an order preserving function implies that the results may hold for a non-order preserving function as well.

Corollary 2. Let X be any finite domain with elements $x_i$, $x_2, \ldots, x_n$ and let each element have associated frequency $f_1, f_2, \ldots, f_n$ such that $\Sigma_{i=1}^n f_i = 1$. Let Y be a domain of size 256 and have elements $y_1, y_2, \ldots, y_{256}$. Then there exists a function S such that for each element $y_i$ of Y, either $\Sigma_{x \in S^{-1}(y_i)} f(x) \leq 2/256$ or $S^{-1}(y_i)$ is a single element of X.

The theorem and corollary allow mappings that limit the amount of values in the base data assigned to any non-unique code to be created. This directly indicates that the amount of time that is needed to access the base data may be limited. It should be noted that Theorem 1 and Corollary 2 apply when the domain X is a compound space. For example, X may be the domain of country, city, biological sex, marital status, employment status, etc., and the theorem may still apply.

3) Numerical Compression Maps

For numeric data types, conventional loss-less compression techniques, such as frame-of-reference (FOR), prefix suppression, and null suppression, work by storing the value as a relative value from some offset. All these techniques support operations in compressed form; in particular, they can execute equality predicates, range predicates, and aggregation operators without decompressing. To support aggregation efficiently, however, each of these techniques conserves differences—given base values a and b, their encoded values $e_a$ and $e_b$ satisfy $e_a-e_b=a-b$. This may limit their ability to change the entropy of high order bits, as these bits cannot be changed and can only be truncated if every value in a column has all 0's or all 1's on these high-order bits.

To avoid the disadvantages of conventional loss-less compression techniques, various embodiments of the present invention implement lossy compression to construct the compression maps. In contrast to the lossless techniques, lossy compression is focused only on maximizing the utility of the bits in the sketch. One way to achieve this while preserving order is to construct an equi-depth histogram that approximates the common data format (CDF) of the input data, and then to create codes based on the endpoints of each histogram bucket. When given a value in a numerical domain, the output of the compression map is then simply the histogram bucket that a value belongs to. In one embodiment, the approximately equi-depth histograms are created by sampling values uniformly from the base column, sorting these values, and then generating the endpoints of each bucket based on this sorted list.

Figure 3B:
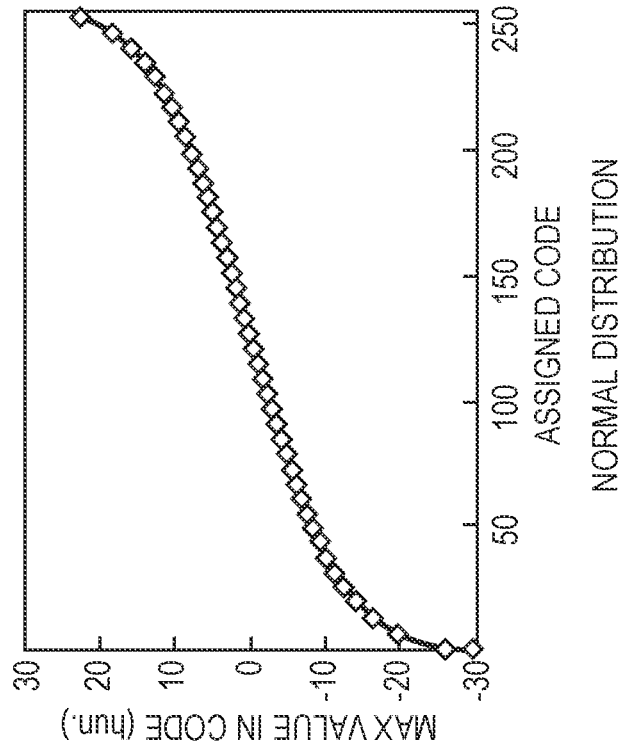
FIGS. 3A and 3B depict exemplary mappings and the corresponding data distributions using histograms for two different data sets in accordance with various embodiments.
Figure 3A:
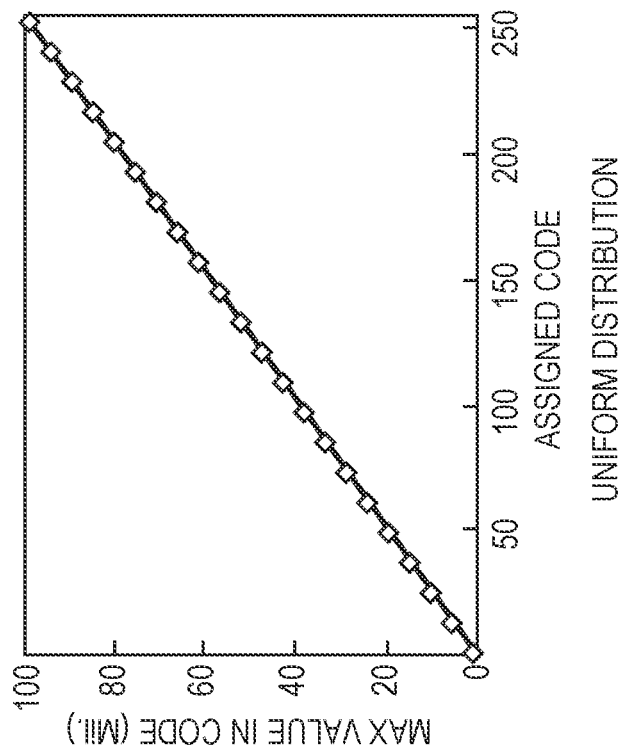

Because histogram buckets are contiguous, storing the endpoint of each bucket i is sufficient to know the range that a histogram bucket covers. FIGS. 3A and 3B depict exemplary mappings using histograms for two different data sets. In both figures, 200,000 samples are utilized to create 256 endpoints. The uniform distribution goes from 0 to 10,000, 000 and the normally distributed data is of mean 0 and variance 1000. The codes for the uniform distribution are evenly spaced throughout, while the codes for the normal distribution are farther apart towards the endpoints of the distribution and closer together towards the mean. The histograms capture the distributions of both functions and evenly space the values in the base data across the codes.

In various embodiments, a frequent value is defined as a value that appears in more than 1/z of the base data values, where z represents a number of the endpoints. To handle these frequent values, the procedure described above is performed to create a sorted list of sampled values. If a value represents more than 1/z of a sample of size n, then one of the values in the sorted list at $$\left(\frac{n}{z}, \frac{2n}{z}, \ldots, \frac{(z-1)n}{z}\right)$$

must be that value. Thus, for each of the z endpoint values, the column-sketch approach can search for the first and last occurrence of that value and check if it represents more than 1/z of the data. If so, it then marks the middle position of that value in the array and gives the value a unique code, $$c \times \frac{\text{midpoint}}{n}$$

(rounded to nearest integer), where c represents the number of codes in the column sketch. In the case that z<c and that two values would be given the same unique code c, the more frequent value may be given that unique code. Though a smaller value of z may create faster average query times, an exemplary z is chosen to be 256 such that making a code unique does not increase the proportion of values in non-unique codes.

In various embodiments, after finding the values that deserve a unique code and giving them associated code values, the sorted lists are equally partitioned between each unique code and the remaining code values are assigned accordingly. The identification of unique codes is in the worst case comparable to a single pass over the sample, and the partitioning of non-unique codes is then a constant time operation.

In one embodiment, an additional constraint forbidding unique codes from occupying subsequent positions is added such that updates cannot force a re-encoding. If in the prior procedure values $v_i$ and $v_{i+1}$ would be given unique codes i and i+1, respectively, only the more frequent value is given a unique code. As a note, for values to be assigned subsequent codes, the less frequent code can contain no more than $$\frac{3}{2c}$$

of the sampled values, and so this does not change the previous robustness results for no non-unique code having too many values. In one implementation, the first and last codes in the compression map are not allowed to be unique.

For the column-sketch mapping to have approximately equal numbers of values in each code, in various embodiments, the sampled histogram created from the empirical CDF closely follows the distribution of the base data. The Dvoretzky-Kiefer-Wolfowitz inequality may provide bounds on the convergence of the empirical CDF $F_n$ of n samples towards the true CDF F, stating: $P(\sup_{x \in \mathbb{R}} \|F_n(x) - F(x)\| \geq \in) \leq 2e^{-n\in^2}$. In this equation, F, the true distribution, may be treated as an unknown quantity and the column as an instance of F; alternatively, the column may be treated as a discrete distribution having CDF exactly equal to the CDF of the base data. In both cases, sampling from the base column n times gives the required result on the distance of the sampled data's empirical CDF $F_n$ from the true CDF F. In some embodiments, any column with less than 4/256 of the base data provides performance benefits during scans, and the column-sketch mapping does not assign a single non-unique code any proportion of values that it estimates as over 2/256. Therefore, a useful value of $\in$ is 2/256. With 200,000 samples as described above, the chance of an error of this amount may be less than $10^{-5}$.

4) Categorical Compression Maps

Unlike numerical distributions, categorical distributions often have values that take up significant portions of the dataset. In addition, certain categorical distributions may have no need for ordering. Conventionally, categorical distributions have been encoded using (optionally order preserving) dictionary encoding. Dictionary encoding works by taking each unique value in a dataset and giving it a numerical code. A simple example is the states in the United States. While this may be declared as a varchar column, there will be only 50 distinct values and so each state can be represented by a number between 0 and 49. Since each distinct value requires a distinct code, the number of bits needed to store a dictionary encoded value is $[\log_2 n]$, where n represents the number of unique values. FIG. 4 illustrates an exemplary dictionary. Notably, this dictionary may or may not be order-preserving, depending on whether a database user finds the lexicographical order of the states to be of use.

In various embodiments, the compression maps for categorical distributions look similar to dictionary encoding, except that rare codes have been collapsed in on each other, making the number of code values smaller. The primary benefit of this collapsing is that a scan of the sketched column reads less memory. There is, however, also a processing benefit as the number of code values in a non-injective encoding may be chosen such that codes are of fixed byte length. For example, for a dataset having 1200 unique values, a dictionary encoded column needs 11 bits per value. If these codes are packed densely one after the other, they will not begin at byte boundaries and the CPU will need to unpack the codes to align them on byte boundaries. If they are not packed densely, then the codes are padded to 16 bits, which in turn brings significantly higher data movement costs. Using the column-sketch approach described herein, the lossy encoding scheme may choose the number of bits to be a multiple of 8, thereby saving data movement without creating the need for code unpacking.

FIG. 4 depicts a comparison of a regular ordered dictionary to an exemplary lossy dictionary for states in the United States. Only the unique codes are shown, with the non-unique codes in the implied gaps. Although this is a simplified example, it shows various properties that are held for lossy dictionaries. The most frequent values, in this case the most populous states, are given unique codes, whereas rarer values share codes. For example, California is given the unique code 1, whereas Wyoming shares code 14 with Wisconsin, West Virginia and several other states. The 7 unique codes cover nearly 50% of the population of the U.S. The other 50% of the population are divided amongst the 8 non-unique codes, with the non-unique codes having an expected 6.25% of the data each. This is due to the low number of non-unique codes. For example, if this approach is applied to cities in the United States, of which there are around 19,000, and have 128 unique codes and 128 non-unique codes, each non-unique code would expect to have only 0.6% of the data.

The categorical distributions may have no need for data ordering; therefore, any value may be assigned to any code value. This freedom of choice makes the space of possible compression maps very large, but also gives rise to fairly good intuitive solutions. In various embodiments, the compression map is determined based on three major design decisions, including the number of values that are assigned with unique codes, the values that are assigned with unique codes, and the approach for distributing values amongst the non-unique codes.

In one implementation, the most frequent values are assigned with unique codes. This is robust in that it bounds the number of times that the base data has to be accessed for any predicate. More aggressive (but potentially less robust) approaches may involve analyzing query history to assign unique code values. In addition, the choice of how many unique codes to create may be a tunable design decision, depending on the requirements of the application at hand. Two exemplary ways for making this decision are provided: one way is to give every value that occurs with more than some frequency z in the sample a unique code value, leaving the remaining codes to be distributed amongst all values with frequency less than the specified cutoff. This parameter z has the same tradeoffs as in the ordered case, and tuning it to workload and application requirements is part of future work. As used herein, an exemplary value of z is set to 256 for analogous reasons to the ordered case. The second way of assigning unique codes is to set a constant value for the number of codes that are unique. The second approach works particularly well for certain values. For example, if there are exactly 128 unique codes, the first or last bit of code values may be utilized to delineate unique and non-unique codes.

In one embodiment, the data is ingested using a hash function to relatively evenly distribute the values amongst the non-unique codes. If there are c codes and u unique codes, the codes $0, 1, \ldots, u-1$ may be assigned with unique codes. When encoding an incoming value, a hash table containing the frequent values is first checked to see if the incoming value is uniquely encoded. If the value is uniquely encoded, its code is written to the sketched column. If not, the value may be then encoded as $u+[h(x) \% (c-u)]$.

As described above, one of the most important characteristics for improving scanning performance is making sure that the most frequent values are given unique codes. FIGS. 5 and 6 depict the maximum number of data items given to any non-unique code as well as the average across all non-unique codes. In both figures, 100,000 tuples are given 10,000 unique values, with the frequency with which each value following a Zipfian distribution is observed. The rare values are distributed amongst the non-unique codes by hashing. In FIG. 5, the skew parameter is kept at 1 and the number of unique codes are varied. In FIG. 6, 128 unique codes are used and the skew of the dataset are varied. As shown, choosing a moderate number of unique codes may allow each non-unique code to have a reasonable number of values in the base data. In addition, for datasets having both high and low skew, the number of tuples in each non-unique code is a small proportion of the data.

In some embodiments, the ordered categorical data shares properties of both unordered categorical data and of numerical data. Queries that ask questions about some range of elements in the domain are expected (like numerical data). In addition, queries that predicate on equality comparisons may be expected (like unordered categorical data). Spreading values in the domain evenly across codes may achieve the properties needed by both. Thus, the algorithm given for identifying frequent values in numerical data described above may work well for ordered categorical data as well.

C. Predicate Evaluation Over the Column Sketch

In addition, codes that may be considered the endpoint of the query may be used for any predicate evaluated by the column sketch. For example, the comparison B<x described above has the endpoint $S(x)$. For range predicates with both a less than and greater than clause, such as $x_1<B<x_2$, the predicate has two endpoints: $S(x_1)$ and $S(x_2)$. And while technically an equality predicate has no endpoint since it is not a range, $S(x)$ may be treated as an endpoint of the predicate B=x for notational consistency.

1) Single Instruction, Multiple Data (SIMD) Instructions

In various embodiments, the column-sketch approach uses SIMD instructions to achieve data-level parallelism by executing one instruction over multiple data elements at a time. The instructions look like traditional CPU instructions, such as addition or multiplication, but have two additional parameters. The first additional parameter is the size of the SIMD register in question and is either 64, 128, 256, or 512 bits. The second parameter is the size of the data elements being operated on, and is either 8, 16, 32, or 64. For example, the instruction _mm256_add_epi8 (_-_ m256i a, _m256i b) takes two arrays, each with 32 elements of size 8 bits, and produces an array of thirty-two 8-bit elements by adding up the corresponding positions in the input in one go.

2) Scan API

In addition, a column-sketch scan may take in the column sketch, the predicate operation, and the values of its endpoints. It may output a bitvector of matching positions or a list of matching positions, with the default output being a bitvector. In one embodiment, a position list is used for very low selectivities and a bitvector is used for higher selectivities. This is because at high selectivities, the position list format requires large amounts of memory movement.

3) Scan Procedure

FIG. 7 depicts an exemplary algorithm for the SIMD-based column-sketch scan using Intel's AVX instruction set and producing bitvector output. The inner part of the nested loop is responsible for the logical computation of which positions match and which positions possibly match. In the first line, the 16 codes are first loaded before performing the two logical comparisons. For the less than case, the only endpoint is S(x), and this value is checked using the equality predicate on line 10. For each position matching this predicate, there may be a need to go to the base data.

After these comparisons, the definitely qualifying positions are translated into a bitvector and stored in memory immediately. For the possibly matching positions, a conditional store is performed. Left out of the code for reasons of brevity, the conditional store code segment first checks if its resulting bitvector is all zeros. If not, it may translate the conditional bitvector into a position list and stores the results in a small buffer on the stack. The resulting bitvector for possibly matching values are usually all zeros as the column sketch is created such that no code holds too many values, and so the code to translate the bitvector into a position list and store positions is rarely executed. In addition, the temporary results may be stored on the stack; storing these temporary results on the heap instead may result in a 15% performance penalty. Referring again to FIG. 7, the column-sketch scan may be divided into a nested loop over smaller segments so the algorithm can patch the resulting bitvector using the base data, while the resulting bitvector remains in the high levels of CPU cache.

4) Unique Endpoints

Various embodiments utilize unique endpoints to make the scans more computationally efficient. This is because if the code S(x) is unique, there is no need to keep track of positions and no need for conditional store instructions. Furthermore, the algorithm may only need a single less-than comparison. After that single comparison, it may immediately write out the bitvector. More generally, given a unique code, a scan over a column sketch may completely answer the query without referring to the base data, and thus looks exactly like a normal scan but with less data movement.

5) Equality and Between Predicates

In various embodiments, equality predicates and between predicates are processed similarly to the algorithm depicted in FIG. 7. For equality predicates, the major difference is that, depending on whether the code is unique, the initial comparison may need to store the partial result or the definite result only; it may drop the other store instruction. For two-sided ranges with two non-unique endpoints, there are both > (i.e., larger than) and < (i.e., smaller than) comparisons and an equality check on both endpoints. The list of possible matches is the logical or of the two equality checks, and the list of definite matches is the logical and of the two inequality comparisons. The rest of the algorithm may be identical. In addition, if an endpoint is unique, the equality comparison for that endpoint may be removed, similar to the one sided case.

6) Two Byte Column Sketch

The column-sketch approach described so far is based on a single byte. It, however, may be applied to two (or more) bytes. For example, if the approach is based on two bytes, the logical steps of the algorithm may remain the same and the only change is replacing the 8 bit SIMD banks with 16 bit SIMD banks.

D. Performance Modeling

The column-sketch approaches may include a performance model assuming that performance depends on data movement costs.

1) Notation

In some embodiments, $B_b$ represents the size of each value in the base data in bytes and $B_s$ represents the size of the codes used in the sketch (both possibly non-integer such as ⅞ for a 7 bit column sketch). In addition, n represents the total number of values in the column, and $M_g$ represents the granularity of memory access. If the modeling is aimed at main memory, $M_g$ may be set at 64.

2) Model: Bytes Touched per Value

In various embodiments, the column sketch is assumed to have no unique codes. A cache line of data in the base data is needed by the processor if at least one of the corresponding codes in the sketched column matches the endpoint of the query. If there is only one endpoint of the query, the probability that any value takes on the endpoint code is $1/2^{8B_s}$. Therefore, the probability that no value in the cache line takes on the endpoint code is $$1 - \left(\frac{1}{2^{8B_s}}\right)^{\left\lceil \frac{M_g}{B_b} \right\rceil},$$

with the ceiling coming from values which have part of their data in the cache line. The chance that the cache line is touched is the complement of that number, and so the total number of bytes touched per value can be computed as:

$$B_s + B_b \left[ 1 - \left(\frac{1}{2^{8B_s}}\right)^{\left\lceil \frac{M_g}{B_b} \right\rceil} \right]$$

By plugging in $B_b$=4, 1 for $B_s$=1, and 64 for $M_g$=64, the resulting value is 1.24 bytes. If 8 is used for $B_b$, this remains at 1.24 bytes. In the case that the query has two endpoints, the $1/2^{8B_s}$ term becomes $2/2^{8B_s}$ and so the equation becomes:

$$B_s + B_b \left[ \left[ 1 - \left(\frac{2}{2^{8B_s}}\right)^{\left\lceil \frac{M_g}{B_b} \right\rceil} \right] \right].$$

From here, if $B_s$ is kept at 1 and $M_g$=64, then $B_b$=4 gives an estimated cost of 1.47 bytes. Again, using $B_b$=8 gives 1.47 bytes as well. Thus, for both one and two endpoint queries, and for both 4-byte and 8-byte base columns, a column sketch scan has significantly less data movement than a basic table scan.

Various embodiments may take into account unique codes. Based on the approaches described above, the unique codes may be given to values that take more than 1/256 of the sample. Since the codes partition the dataset, the non-unique codes contain less than 1/256 of the dataset on average. Following similar logic, the result is that creating unique codes may decrease the expected cost of a column-sketch scan in terms of bytes touched for non-unique codes. For unique codes the number of bytes touched per value may be 1.

Figure 8A:
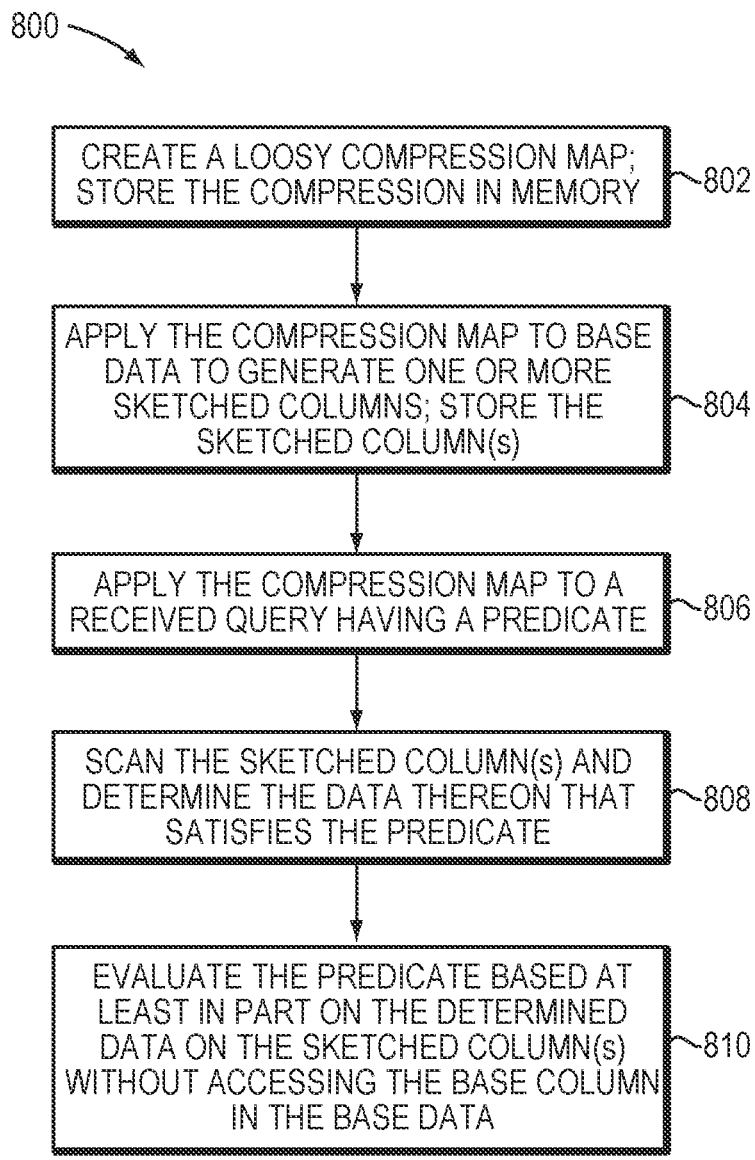
FIG. 8A is a flow chart illustrating an exemplary approach for accelerating data access to a computer memory storing base data and evaluating a query having a predicate in accordance with various embodiments.

FIG. 8A illustrates an exemplary approach 800 for accelerating data access to a computer memory storing base data and evaluating a query having a predicate in accordance with various embodiments. In a first step 802, a lossy compression map may be created to map values in one or more base columns to smaller fixed width codes in one or more sketched columns; the compression map may then be stored in memory. Typically, the compression map may include an array of sorted values (when the compression map is order-preserving) or a hash table having a unique code and a hash function (when the compression map is non-order preserving). In a second step 804, the compression map may be applied to the base data to generate one or more sketched columns; the sketched column(s) may then be stored in memory. In a third step 806, upon receiving the query having the predicate, the compression map may be applied thereto. In a fourth step 808, the sketched column(s) may be scanned and the data thereon that satisfies the predicate may be determined. In a fifth step 810, the predicate can then be evaluated based at least in part on the determined data on the sketched column(s) without accessing the base column in the base data. As a result, the data access and predicate evaluation process may be accelerated.

Figure 8B:
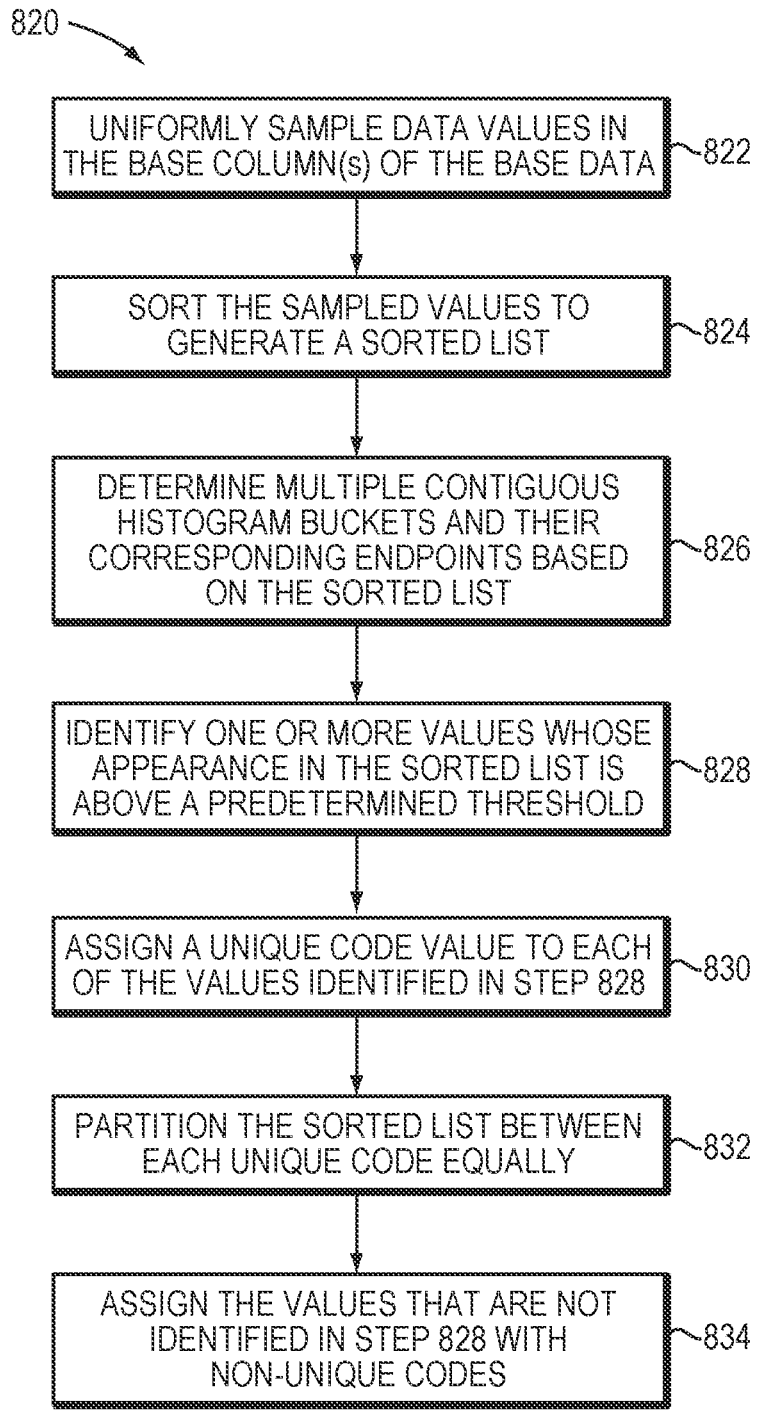
FIG. 8B is a flow chart illustrating an exemplary approach for creating a lossy numerical compression map in accordance with various embodiments.

FIG. 8B illustrates an exemplary approach 820 for creating a lossy numerical compression map in accordance with various embodiments. In a first step 822, data values in the base columns are uniformly sampled. In a second step 824, the sampled values are then sorted to generate a sorted list. In a third step 826, based on the sorted list, multiple contiguous histogram buckets and their corresponding endpoints may be determined. In one embodiment, the histogram buckets have an equi-depth histogram that approximates a common data format of the base data are constructed. In some embodiments, the approach 820 optionally includes identifying one or more values whose appearance in the sorted list is above a predetermined threshold (in step 828). In one embodiment, the threshold is determined based on a number of endpoints. In step 830, a unique code value may be assigned to each of the values identified in step 828. In one embodiment, the sorted list is then equally partitioned between each unique code (in step 832), and the values that are not identified in step 828 may be assigned with non-unique codes (in step 834). The assigned unique and/or non-unique codes may then form a portion of the compression map associating data in the base columns to data in the sketched columns.

Figure 8C:
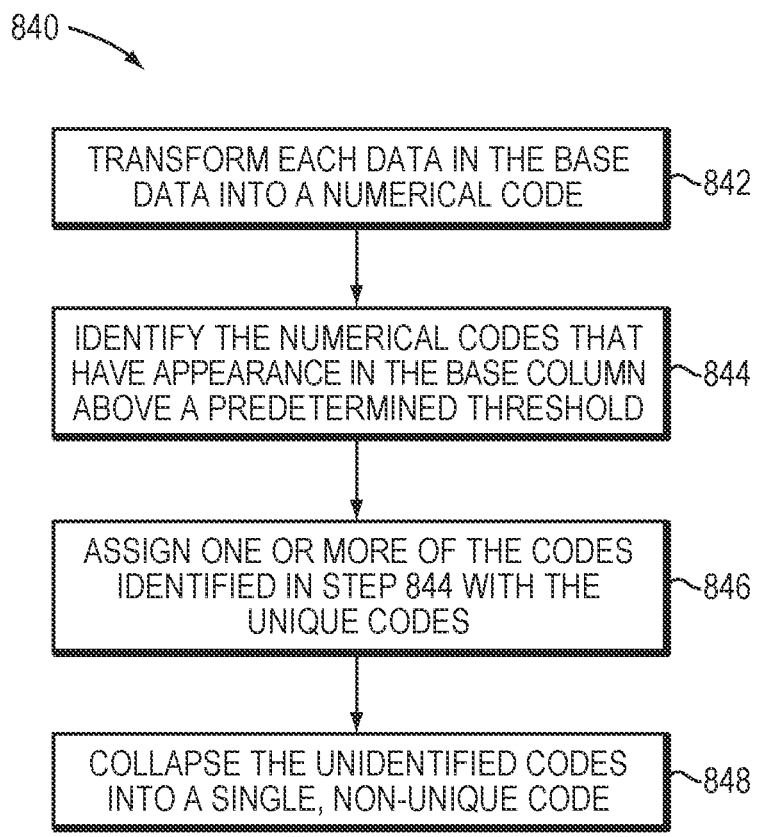
FIG. 8C is a flow chart illustrating an exemplary approach for creating a lossy categorical compression map in accordance with various embodiments.

FIG. 8C shows an exemplary approach 840 for creating a lossy categorical compression map in accordance with various embodiments. In a first step 842, each portion of data in the base data is transformed into a numerical code. In a second step 844, the numerical codes that have appearance in the base column above a predetermined threshold may be identified. In a third step 846, one or more of the codes identified in step 844 may be assigned with the unique codes. The unidentified codes may be collapsed into a single, non-unique code (in step 848). In various embodiments, the data is ingested using a hash function so as to cause the data to be relatively evenly distributed amongst the non-unique codes.

E. System Integration and Memory Overhead

1) System Integration

Many components for implementing the column-sketch approaches described herein may already exist partially or completely in conventional mature database systems. For example, creating the compression map may require sampling and histograms; they are supported in nearly every major system. The SIMD scan is similar to optimized scans that already exist in analytic databases, and Zone Maps over the base data can filter out the corresponding positionally aligned sections of a column sketch. Adding data and updating data in the column sketch are similar to data modifications in columns that are dictionary encoded. Because the column-sketch scan is faster than a traditional scan, optimization may use the same selectivity-based access-path selection between traditional indices and the column sketch, with a lower switch point. The column-sketch approaches also work naturally over any ordered data type that supports comparisons. This contrasts with related techniques such as early pruning techniques, which need modifications to various types, such as floating point numbers, to make them binary comparable. Finally, the column-sketch approaches may make no change to the base data layout; thus all other operators except for select may be left unchanged.

2) Memory Overhead

Assume $b_s$ is the number of bits per element in the column sketch, $b_s \times n$ bits of space may be needed for the sketched column. If $b_b$ is the number of bits needed for a base data element, then each dictionary entry needs $b_b+1$ bits of space, where the extra bit comes from marking whether the value for that code is unique. The size of the full dictionary is then $(b_b+1) \times 2^b$ bits. Notably, b is usually quite small (e.g., as used herein, b=8 at all points to create byte alignment) and so the dictionary is also usually quite small. Additionally, the size of the dictionary is independent of n, the size of the column; thus the overhead of the column sketch may approach $b_s \times n$ bits as n grows. Additionally, it should be noted that the column-sketch approaches may work best with compression techniques on the base column that allow efficient positional access. This is normally the case for most analytical systems when data is in memory, as data is usually compressed using fixed width encodings.

F. Experimental Analysis

As demonstrated below, contrary to the conventional predicate evaluation methods, the column-sketch approaches in various embodiments provide an efficient and robust access method regardless of data distribution, data clustering, or selectivity. In addition, the column-sketch approaches may efficiently ingest new data of all types, with order of magnitude speedups for categorical domains.

Performance of the column-sketch approaches described herein was compared against that of an optimized sequential scan, BitWeaving/V ("BitWeaving"), Column Imprints and a B-tree index. The scan, termed FScan, was an optimized scan over numerical data which utilizes SIMD, multi-core, and zone-maps. For BitWeaving and Column Imprints, the original code of the authors with some minor modifications to Column Imprints was utilized to adapt it to the AVX instruction set. The B-tree utilized multi-core and had a fanout which was tuned specifically for the underlying hardware. In addition, for categorical data the column-sketch approaches were compared against BitWeaving and "SIMD-Scan," which is an SIMD scan that operates directly over bit-packed dictionary compressed data. As used herein, a term "CScan" is used to refer to the SIMD Scan. All experiments were in-memory and included no disk I/O.

In addition, the outputs of the scan procedure for the column sketch, BitWeaving, Column Imprints and FScan were identical. As an input the scan took a single column and as an output it produced a single bitvector. The B-tree index scan took as input a single column and output a list of matching positions sorted by position. This is because B-trees stores their leaves as position lists and so this optimizes the B-tree performance.

The experiments were run on a machine with 4 sockets, each equipped with an Intel Xeon E7-4820 v2 Ivy Bridge processor running at 2.0 GHz with 16 MB of L3 cache. Each processor has 8 cores and supports hyper-threading for a total of 64 hardware threads. The machine includes 1 TB of main memory distributed evenly across the sockets and four 300 GB 15K RPM disks configured in a RAID-5 array. Debian "Wheezy" version 7.7 having 64-bit was run on Linux 3.18.11. To eliminate the effects of NUMA on performance, each of the experiments was run on a single socket. The performance measurements were evaluated in terms of cycles per element. For this machine and using a single socket, a completely memory bound process achieved a maximum possible performance of 0.047 cycles per byte touched by the processor.

In addition, unless otherwise noted, the column used consisted of 100 million values. When conducting predicate evaluation, each method was given use of all 8 cores. The numbers reported were the average performance across 100 experimental runs.

1) Uniform Numerical Data

The first experiment demonstrates that the column-sketch approaches described herein provide efficient performance regardless of selectivity. Numerical data of element size four bytes, distributed uniformly throughout the domain, and having varied selectivity from 0 to 1 was tested. The predicate was a single sided<comparison, with the endpoint of the query being a non-unique code of the column sketch. For this experiment only, performance was reported as milliseconds per query, as the metric cycles/element was not very informative for the B-Tree.

Figure 9:
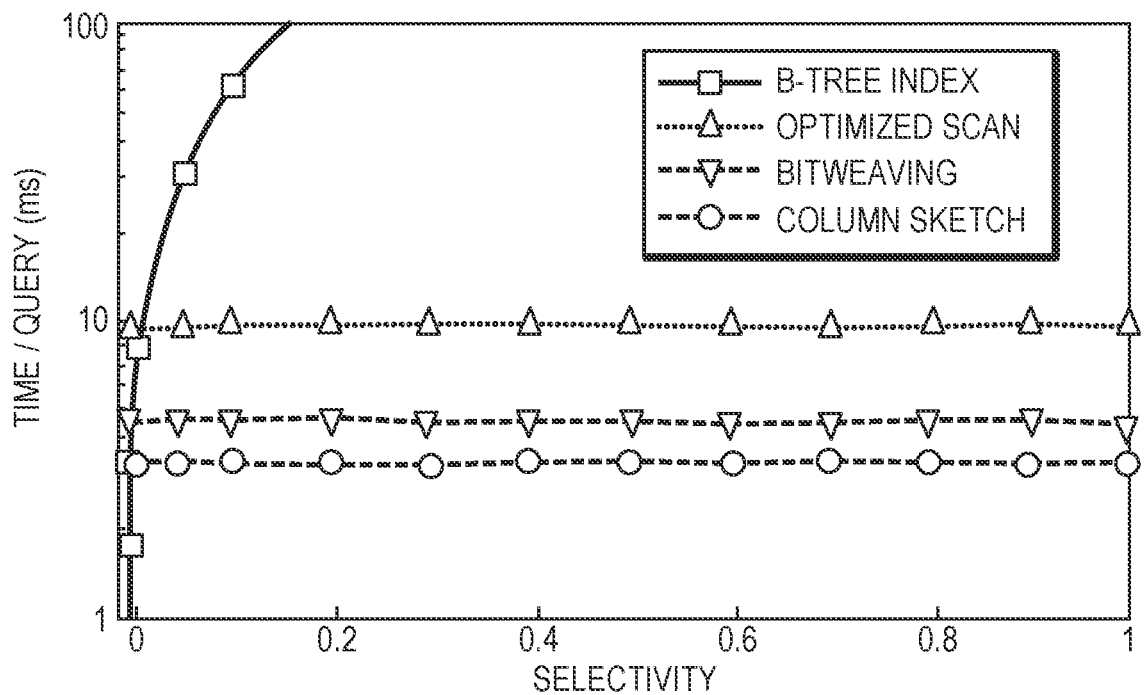
FIG. 9 depicts the response time for various access approaches in accordance with various embodiments.

FIG. 9 depicts the response time for all five access methods as the selectivity was varied. For very low selectivities below 1%, the B-tree outperformed all other techniques. Once selectivity reached even moderate levels, however, the B-tree performance significantly degraded. This is because the B-tree index needed to traverse the leaves at the bottom level of the tree, which stalled the processor, thus wasted cycles. In contrast to the B-tree, the column sketch described herein, Column Imprints, BitWeaving, and FScan viewed data in the order of the base data and consistently fed data to the processor.

Figure 10:
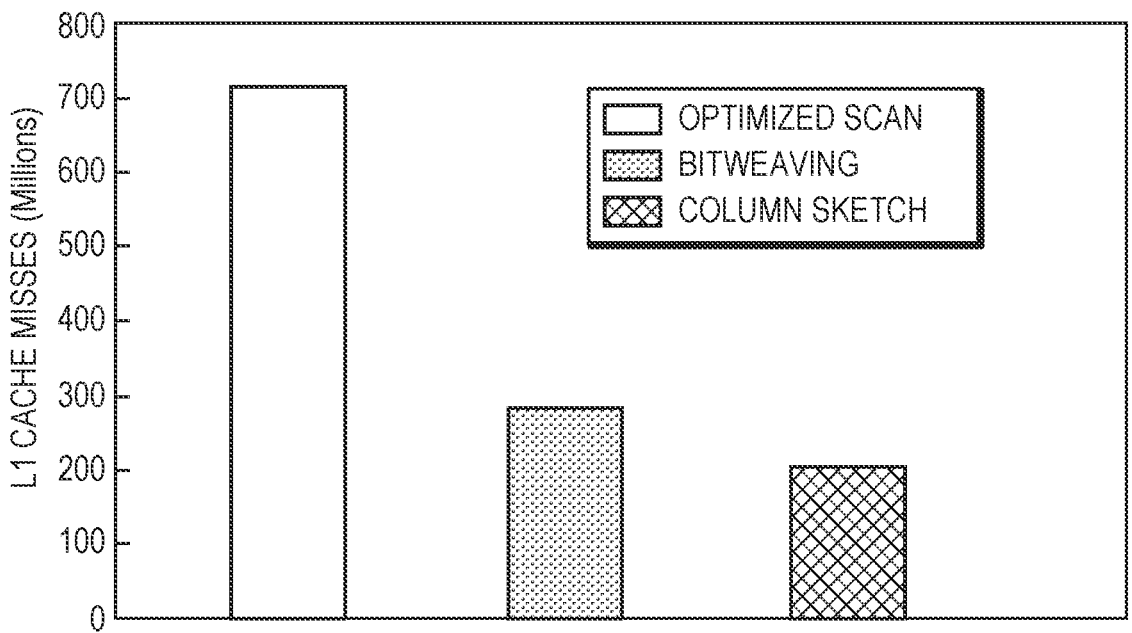
FIG. 10 illustrates the column-sketch approach in accordance with various embodiments incurring fewer cache misses than conventional approaches.

During predicate evaluation, BitWeaving, Column Imprints, the column sketch and the optimized scan all continually saturated memory bandwidth. The column sketch, however, performed the best by reading the fewest number of bytes, outperforming the optimized scan by 2.92 times, Column Imprints by 3.16 times and BitWeaving by 1.4 times. FIG. 10 breaks down these results, showing the number of L1 cache misses for the column sketch against its two closest competitors, FScan and BitWeaving. The results aligned closely with the performance numbers, with the column sketch seeing 1.39 times fewer L1 cache misses than BitWeaving and 3.54 times fewer L1 cache misses than the optimized scan.

Figure 11:
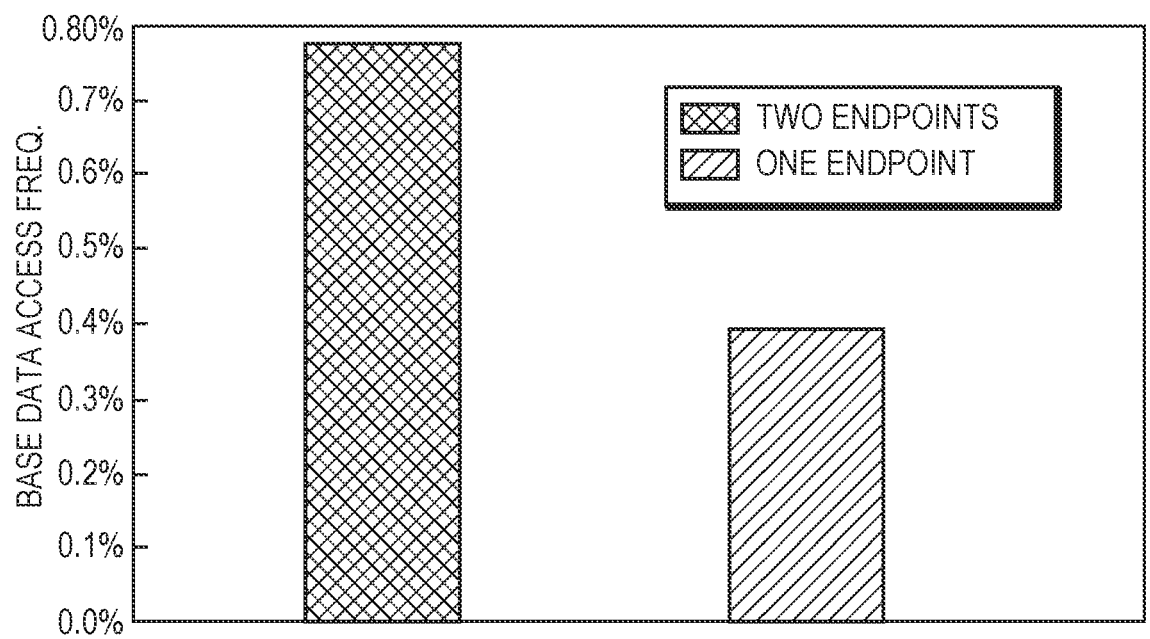
FIG. 11 depicts infrequent access to the base data required by the column-sketch approach in accordance with various embodiments.

In performing predicate evaluation, the optimized scan and Column Imprints saw nearly every value, leading to their high data movement costs. This is because the Zone Map and Column Imprint work best over data which is clustered; when data is not clustered, as was the case here, these techniques provide no performance benefit. BitWeaving and the column sketch also saw every value, but decreased data movement by viewing fewer bytes per value. BitWeaving achieved this via early pruning, but this early pruning tended to start around the 12th bit. Additionally, even if BitWeaving eliminated all but one item from a segment by the 12th bit, it may need to fetch that group for comparison multiple times to compare the 13th, 14th, and so on bits until the final item had been successfully evaluated. In contrast to BitWeaving, the column sketch pruned most data by the time the first byte had been observed, with FIG. 11 showing that a single endpoint query accessed around 0.4% of tuples in the base data. As well, in the rare case an item had not been resolved by the first byte, the column sketch went directly to the base data to evaluate the item. This is because once early pruning had reached a sparse stage where most tuples had or had not qualified, query execution directly evaluated the small number of values left over.

Figure 12:
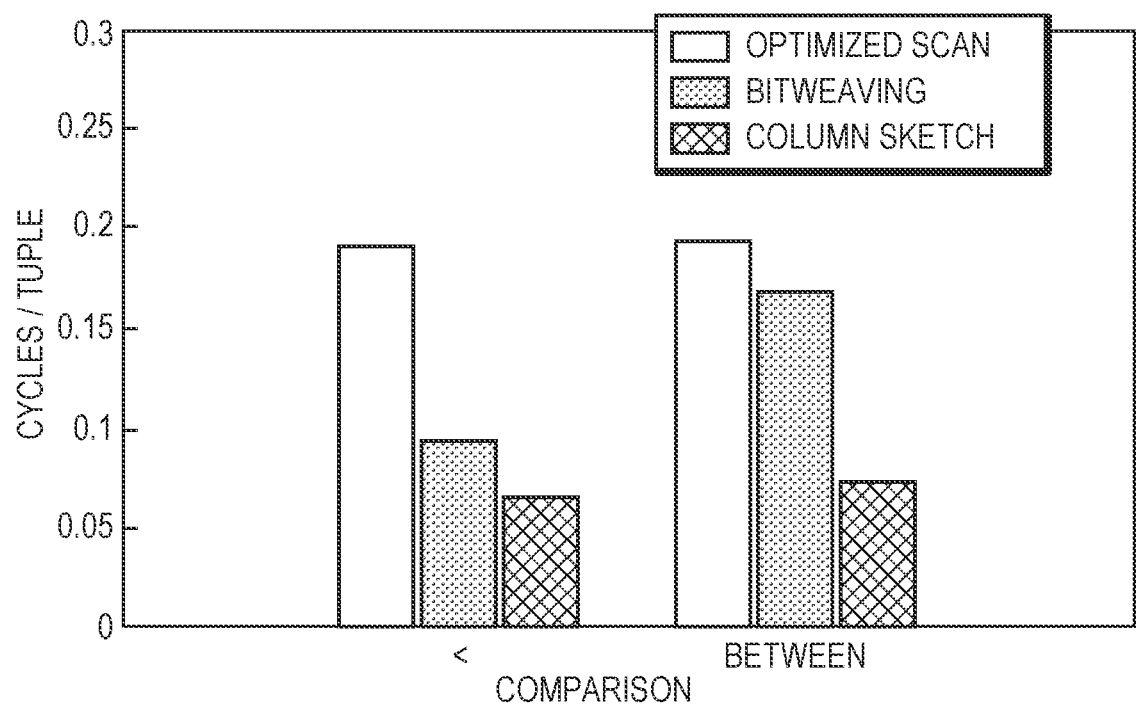
FIG. 12 illustrates the number of cycles required by the column-sketch approach in accordance with various embodiments and conventional approaches for evaluating single and double sided predicates.

FIG. 12 depicts the performance of the column sketch, BitWeaving, and the optimized scan in terms of cycles/tuple across a single comparison and between predicates. In both cases, the column sketch performed significantly better than FScan and BitWeaving. For Fscan, its performance across both types of predicates was completely memory bandwidth bound and constant at 0.195 cycles/tuple. For BitWeaving, its performance on the between predicate was nearly half of it single comparison performance, going from 0.093 cycles/tuple to 0.167. This, however, was a side effect of the given distribution code, which evaluated the < predicate completely before evaluating the > predicate after. If the two predicates had been evaluated together, only a small decrease in performance would have been expected. For the column sketch, it saw a minor drop in performance from 0.066 cycles/tuple to 0.074 cycles/tuple. This small drop in performance of the column sketch came from having two non-unique endpoints, and not from increased computational costs. In the case one of the two endpoints was unique, the performance stayed at 0.066 cycles/tuple. If both endpoints were unique, the performance was 0.053 cycles/tuple.

The performance of the column sketch substantially matched what the model predicted. The model predicted that 1.24 bytes would be touched for a single non-unique endpoint, and 1.47 bytes for two endpoints. Taking into account the resulting bitvector and multiplying this by the saturated bandwidth performance of 0.047 cycles/byte, the performance based on the model having 0.064 for a single endpoint and 0.075 for two endpoints were expected.

Figure 13:
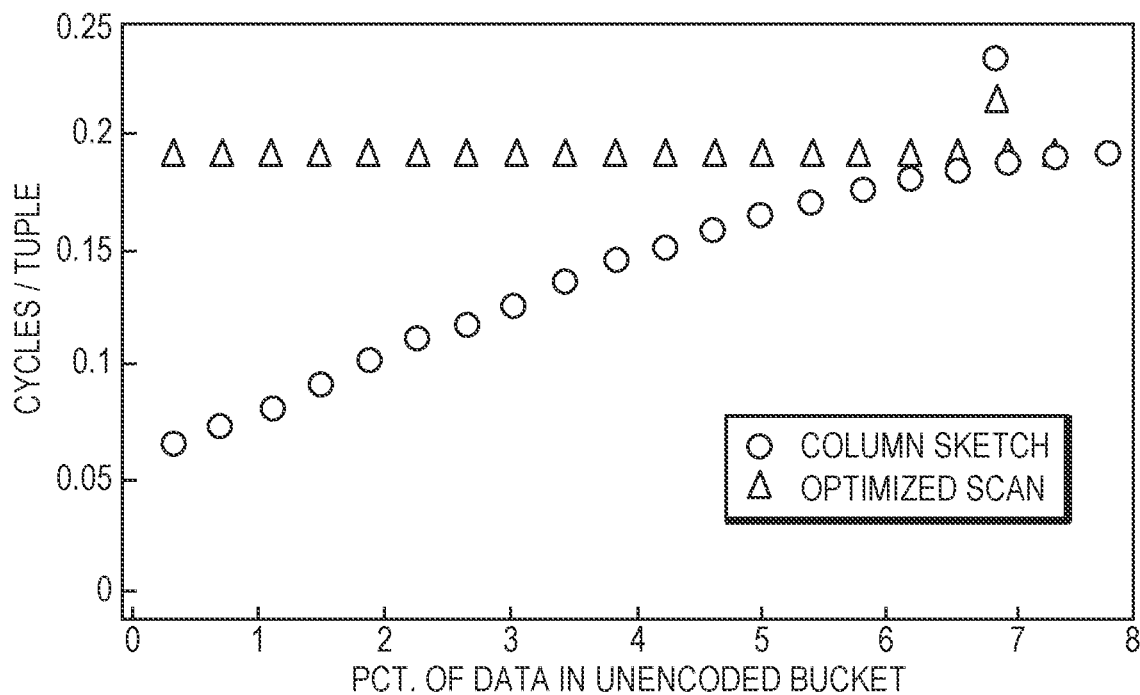
FIG. 13 illustrates the performance comparison of the column-sketch approach in accordance with various embodiments and a conventional approach.

FIG. 13 depicts the performance of the column sketch as more and more data was put into the single non-unique endpoint of the < comparison. The leftmost data point in the graph shows the expected performance of the column sketch, i.e., when the non-unique code has 1/256 of the data, and each subsequent data point has an additional 1/256 of the data assigned to that code. Notably, the analysis above indicates that data points beyond the first 4 points will occur more with probability less than $1/10^5$. The eventual crossover point when the performance of the column sketch degrades to worse than the performance of a basic scan is when the single endpoint holds 20/256 of the data.

Figure 14:
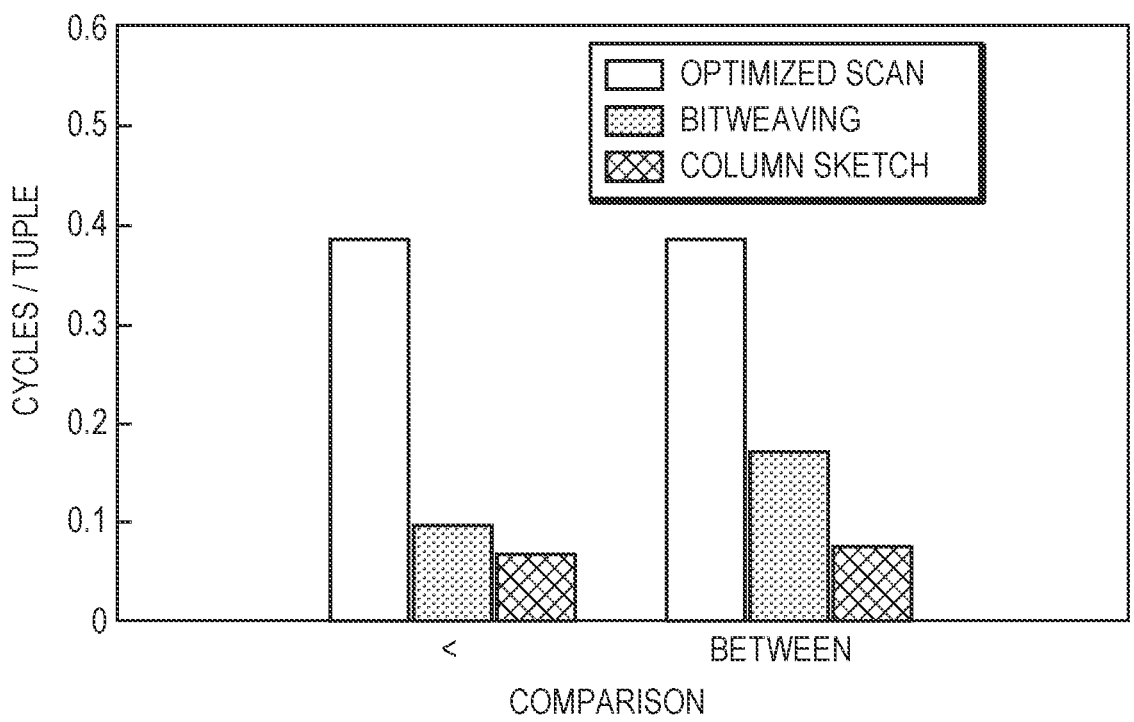
FIG. 14 illustrates the performance comparison of the column-sketch approach in accordance with various embodiments and the conventional approaches.

The second experiment shows how performance changes for traditional scans, BitWeaving, and column sketch scans as the element size increases from four to eight bytes. The setup of the experiment was the same as before, i.e., the response time for queries was observed over uniformly distributed data. Note that the index or Column Imprints are not used from now on, as across all experiments the two closest competitors are FScan and BitWeaving. The results are shown in FIG. 14.

For FScan, the larger element size meant a proportional decrease in scan performance, with codes/cycle going from 0.193 to 0.386. For the column sketch, however, the given code size was controlled independently of the element size in the base data. Thus, since the column sketch was aimed at data in memory, the code size was kept at one byte. The scan was then evaluated nearly identically to the scan with base element size four bytes, and had nearly identical performance (0.067 instead of 0.066 cycles/code). Similarly, BitWeaving pruned almost all data by the 16th bit and so saw a negligible performance increase of 0.01 cycles/code. The overall performance increase from using the column sketch was 5.76 times over the sequential scan and 1.4 times over BitWeaving.

2) Skewed Numerical Data

For skewed data, the Beta distribution scaled by the maximum value in the domain was used. The Beta distribution, parameterized by $\alpha$ and $\beta$ is uniform with $\alpha=\beta=1$ and becomes more skewed toward lower values as $\beta$ increases with respect to $\alpha$. The more commonly seen zipfian distribution is more readily applied to categorical data with heavy skew, whereas the Beta distribution is continuous and better captures numerical skew. In the experiment, the element size was 4 bytes; $\alpha$ was kept at 1 and the $\beta$ parameter was varied. All queries were a range scan for values less than $(2^8-1)=255$. Finally, as the performance of FScan was identical to FIG. 8, it was not included in the skewed data experiments. The results are shown in FIG. 15.

FIG. 15 depicts that when the distribution got more and more skewed towards low values, the high order bits tended to be mostly 0s. For BitWeaving, this means the high order bits do not give much data pruning, and as a result the performance of BitWeaving tends to look more like the full column scan. This is a weakness of using encoding which preserves differences, if there are even a trace amount of high values, the high order bits can be nearly all zero. For BitWeaving, performance degradation occurred fairly quickly, as even $\beta=5$ produced a notable performance drop. As $\beta$ increased, the performance degraded more. In contrast, the performance of the column sketch was stable, with the ability to prune data unaffected by the data distribution change.

3) Categorical Data

The second set of experiments verifies that the column sketch described herein provides performance benefits over categorical attributes as well as numerical attributes. Unlike the numerical attributes seen in the previous experiments, categorical data included a significant number of frequent items. As detailed above, these frequent items were given unique codes and then less frequent items were bundled together into the remaining codes. For the purposes of these experiments, the column sketch was encoded with values taking up more than 1/256 of the data being given unique codes. The resulting data set had 65 unique codes and 191 non-unique codes, with unique codes accounting for 50% of the data and non-unique codes accounting for 50% of the data. In this set of experiments, the column sketch provided consistent performance benefits for predicate evaluation regardless of whether the elements predicated on were frequent or infrequent items.

For the dictionary compressed columns, the number of unique elements was varied such that the value size in the base data was between 9 and 16 bits. This matched the size of dictionary compressed columns that took up the majority of execution time in industrial workloads.

Figure 16A:
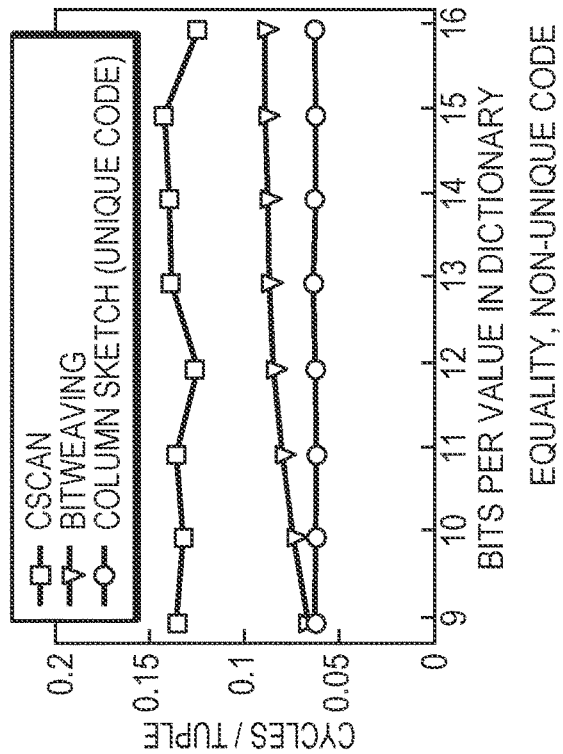
FIGS. 16A-16C depict performance comparisons of the column-sketch approach in accordance with various embodiments and various conventional approaches across unique and non-unique codes and across equality and range.

FIG. 16A depicts that using the column sketch to perform equality predicate evaluation was faster than BitWeaving and CScan. Surprisingly, the technique was more than a 12% improvement over BitWeaving, even for 9 bit values, and saw considerably more improvement against CScan. For the column sketch, the performance improvement increased up to bit 12 against BitWeaving, at which point the performance of BitWeaving became essentially constant. For the CScan, the improvement varied based on the element size in the base column. Due to word alignment, CScan did better on element sizes that roughly or completely aligned with words (such as 12 and 16 bits). For all element sizes, however, the computational overhead of unpacking the codes and aligning them with SIMD registers made it so CScan was never completely bandwidth bound.

Figure 16B:
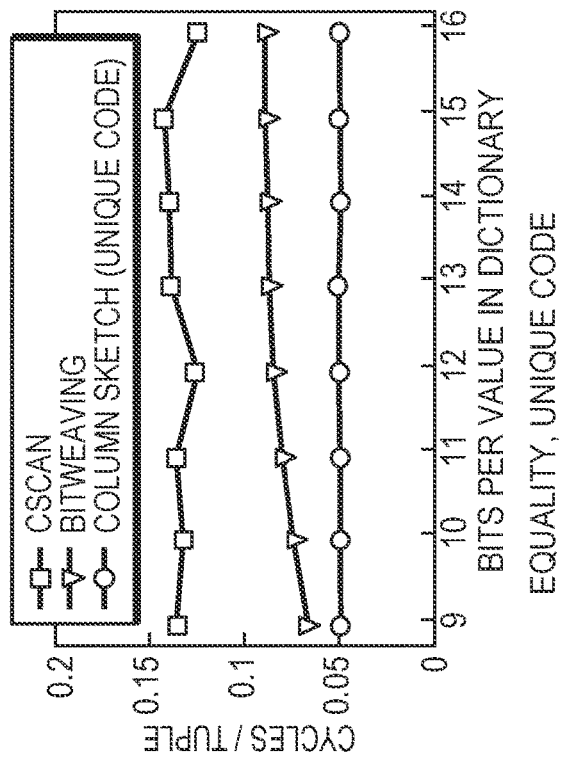
Figure 16C:
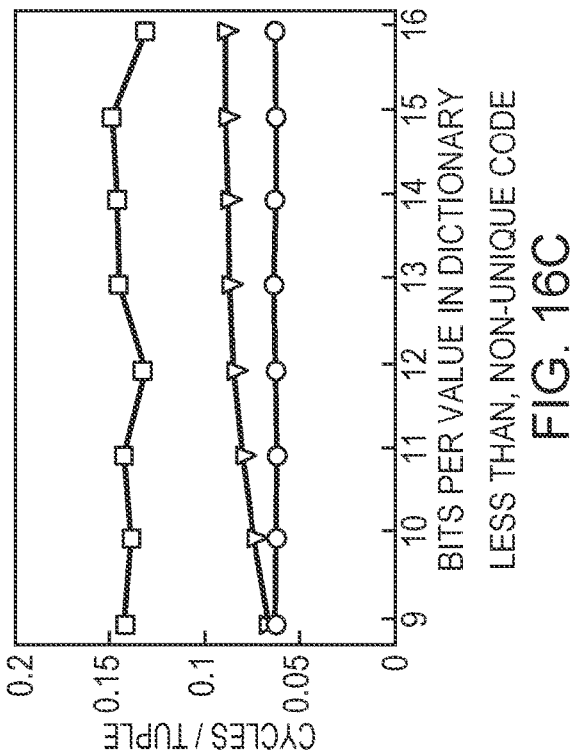

For non-unique codes, the performance of the column sketch was only slightly worse (as shown in FIG. 16B). The performance dropped by 15% as compared to unique codes, with the column sketch remaining more performant than BitWeaving and CScan across all base element sizes. This was again due to the very limited frequency with which the column sketch looked at the base data; in this case, the column sketch was expected to view the base data for one out of every 256 values. Additionally, range comparisons were conducted on categorical data (as shown in FIG. 16C). The results are similar to FIG. 16B. In addition, the range experiments were run twice over the column sketch with different forms on the base data. In the first case, the base data was stored as a text blob; whereas in the second case, the base data was dictionary encoded using non-order preserving codes. In both cases, the performance of the range scan was similar, with the order-preserving column sketch evaluating the predicate for the vast majority of the tuples. This is notable, since both blob text formats and non-order preserving dictionary encoded values are easier to maintain during periods in which new domain values appear frequently.

4) Load Performance

Further, the load performance for both numerical and categorical data was tested; the column-sketch approaches achieved fast data ingestion regardless of data type. For both data ingestion experiments, 100 million elements were loaded in five successive runs. Thus at the end, the table had 500 million elements. In the numerical experiment, the elements were 32 bits and the column sketch contained single byte codes. In the categorical experiment, the elements were originally strings. For BitWeaving, these strings were turned into 15-bit order preserving dictionary encoded values, so that the BitWeaved column can efficiently conduct range predicates. For the column sketch, the strings in the base data were encoded as non-order preserving dictionary encoded values; an order-preserving column sketch was then implemented. As shown previously, this was efficient at evaluating range queries. The time taken to perform the dictionary encoding for the base data was not counted for BitWeaving or the column sketch; rather, the time taken to perform encoding for the column sketch was counted.

The categorical ingestion experiment was then run under two different settings: in the first setting, each of the five successive runs saw some new element values, and so elements can have their encoded values change from run to run. Because there were new values, the order preserving dictionary needed to re-encode old values, and so previous values may need to be updated. In the second setting, there were no new values after the first batch.

Further, the column sketch tends to have fast load performance as the only transformation needed on each item is a dictionary lookup. The data can then be written out as contiguous byte aligned codes. As well, regardless of the new values in each run, the column sketch always has a non-unique code for each value and thus never needs to re-encode its code values. Thus, the column sketch is particularly well suited to domains that see new values frequently, with the column sketch allowing for efficient range scans without requiring the upkeep of a sorted dictionary. In contrast to the column sketch, BitWeaving tends to have a high number of CPU operations to mask out each bit and writes to scattered locations. More importantly, new element values can cause prior elements to need to be re-encoded. Notably, this is not particular to BitWeaving, but an inherent flaw in any lossless order-preserving dictionary encoding scheme, with the only solution to include a large number of holes in the encoding.

In sum, various embodiments of the present invention provide a new indexing technique, the column sketch, to achieve better scan performance regardless of data ordering, data distribution and query selectivity. The column sketch is significantly easier to update and has better performance on scans over a range of differing data distributions compared with the conventional approaches for scan accelerators. In addition, unlike the conventional approaches, the column sketch may provide formal guarantees for performance improvements. Extensions of the column sketch may include usage for operators other than scan, such as aggregations, and approximate query processing.

G. Representative Architecture

Figure 17:
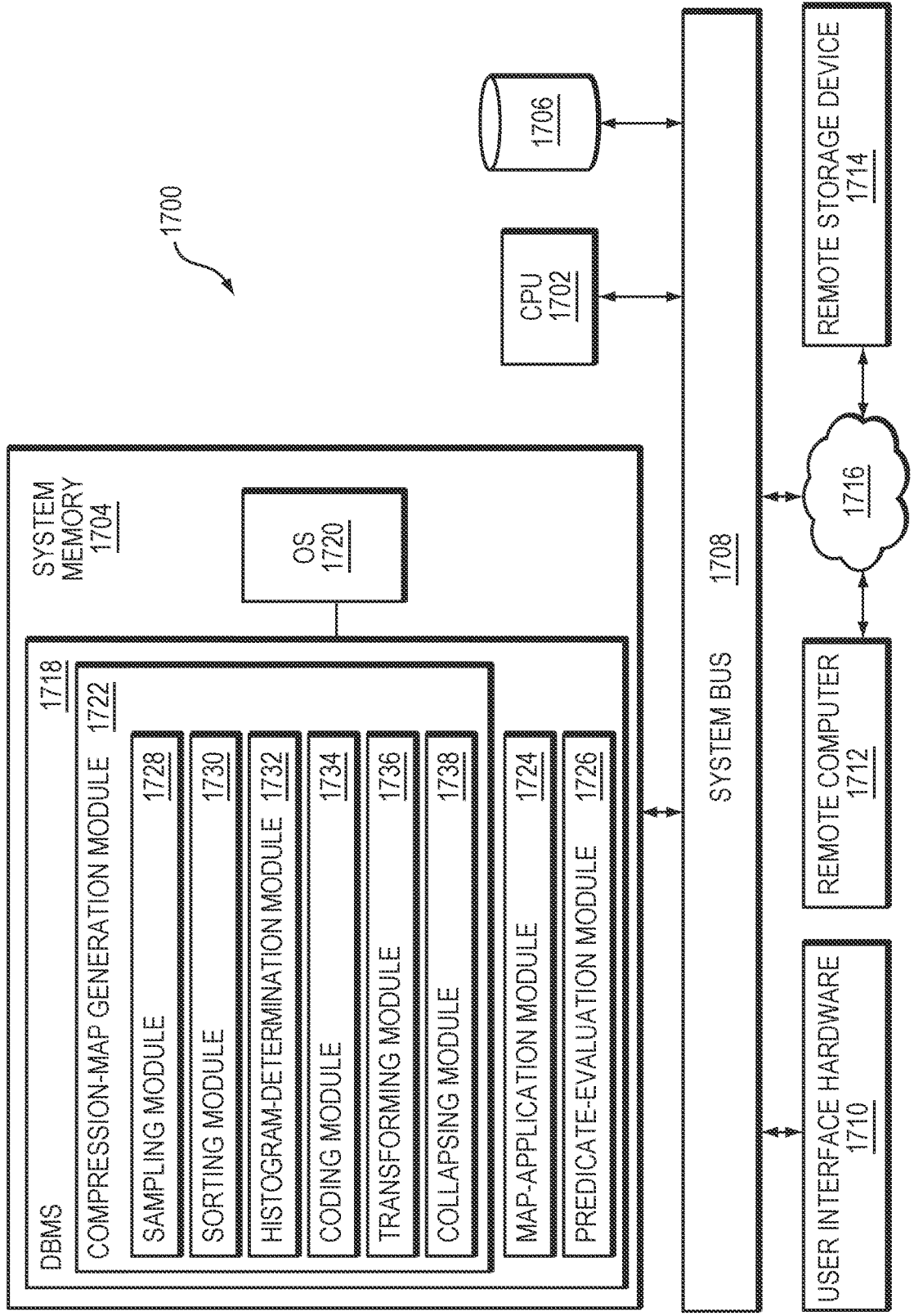
FIG. 17 is a block diagram illustrating a facility for accelerating data access to a computer memory storing the base data and evaluating a query having a predicate using a lossy compression map in accordance with various embodiments.

Approaches for accelerating data access and predicate evaluation in accordance herewith can be implemented in any suitable combination of hardware, software, firmware, or hardwiring. FIG. 17 illustrates an exemplary embodiment utilizing a suitably programmed general-purpose computer 1700. The computer includes a central processing unit (CPU) 1702, at least a main (volatile) memory 1704 and non-volatile mass storage devices 1706 (such as, e.g., one or more hard disks and/or optical storage units) for storing various types of files. The main memory 1704 and/or storage devices 1706 may store the base data having one or more base columns, compression map, and/or one or more sketched columns as described above. The computer 1700 further includes a bidirectional system bus 1708 over which the CPU 1702, main memory 1704, and storage devices 1706 communicate with each other and with internal or external input/output devices, such as traditional user interface components 1710, including, e.g., a screen, a keyboard, and a mouse for receiving a query, as well as a remote computer 1712 and/or a remote storage device 1714 via one or more networks 1716. The remote computer 1712 and/or storage device 1714 may transmit any information (e.g., a query) to the computer 1700 using the network 1716.

In some embodiments, the computer 1700 includes a database management system (DBMS) 1718, which itself manages reads and writes to and from various tiers of storage, including the main memory 1704 and secondary storage devices 1706. The DBMS establishes, and can vary, compression maps and/or sketched columns described herein. The DBMS 1718 may be implemented by computer-executable instructions (conceptually illustrated as a group of modules and stored in main memory 1704) that are executed by the computer 1700 so as to control the operation of CPU 1702 and its interaction with the other hardware components.

In addition, an operating system 1720 may direct the execution of low-level, basic system functions such as memory allocation, file management and operation of the main memory 1704 and/or mass storage devices 1706. At a higher level, one or more service applications provide the computational functionality required for implementing the data access and predicate evaluation approaches using the base data, compression map and sketched columns described herein. For example, as illustrated, the system 1720 may assess a compression-map generation module 1722 stored in the main memory 1704 and/or secondary storage devices 1706 to generate a lossy compression map as described above; the compression map may then be stored in the main memory 1704 and/or secondary storage devices 1706. In addition, the system 1720 may include a map-application module 1724 that applies the compression map to the base data so as to generate one or more sketched columns; the sketched column(s) may then be stored in the main memory 1704 and/or secondary storage devices 1706. In various embodiments, upon receiving a query having a predicate from a user via the user interface 1710 and/or from an application in the remote computer 1712 and/or the computer 1700, the system 1720 may assess the map-application module 1724 to apply the compression map to the received query. In one embodiment, the map-application module 1724 scans the sketched column(s) and determine the data thereon that satisfies the predicate. In addition, the system 1720 may include a predicate-evaluation module 1726 to evaluate the predicate based at least in part on the determined data on the sketched column(s) without accessing the base column in the base data.

In one embodiment, the compression-map generation module 1722 includes a sampling module 1728 to uniformly sample data values in the base column(s) of the base data. In addition, the compression-map generation module 1722 may include a sorting module 1730 that sorts the sampled data values to generate a sorted list. Further, the compression-map generation module 1722 may include a histogram-determination module 1732 that determines multiple contiguous histogram buckets and their corresponding endpoints based on the sorted list. In addition, the compression-map generation module 1722 may include a coding module 1734 that identifies one or more values whose appearance in the sorted list is above a predetermined threshold. In addition, the coding module 1734 may assign a unique code value to each of the values whose appearance is above the predetermined threshold and non-unique codes to the values whose appearance is below the predetermined threshold. In one embodiment, the histogram-determination module 1732 then equally partitions the sorted list between each unique code. In various embodiments, the compression-map generation module 1722 further includes a transforming module 1736 for transforming each categorical data in the base data into a numerical code. Again, the coding module 1734 may then identify the numerical codes whose appearance in the base column is above the predetermined threshold. Based thereon, the coding module 1734 may assign a unique code value to each of the numerical codes whose appearance is above the predetermined threshold. In addition, the compression-map generation module 1722 may include a collapsing module 1738 for collapsing the unidentified numerical codes whose appearance is below the predetermined threshold into a single, non-unique code.

Generally, program modules 1722-1738 include routines, programs, objects, components, data structures, etc. that performs particular tasks or implement particular abstract data types. Those skilled in the art will appreciate that the invention may be practiced with various computer system configurations, including multiprocessor systems, microprocessor-based or programmable consumer electronics, minicomputers, mainframe computers, and the like. The invention may also be practiced in distributed computing environments where tasks are performed by remote processing devices that are linked through a communications network. In a distributed computing environment, program modules may be located in both local and remote computer-storage media including memory storage devices.

In addition, the CPU 1702 may comprise or consist of a general-purpose computing device in the form of a computer including a processing unit, a system memory, and a system bus that couples various system components including the system memory to the processing unit. Computers typically include a variety of computer-readable media that can form part of the system memory and be read by the processing unit. By way of example, and not limitation, computer readable media may comprise computer storage media and communication media. The system memory may include computer storage media in the form of volatile and/or nonvolatile memory such as read only memory (ROM) and random access memory (RAM). A basic input/output system (BIOS), containing the basic routines that help to transfer information between elements, such as during start-up, is typically stored in ROM. RAM typically contains data and/or program modules that are immediately accessible to and/or presently being operated on by processing unit. The data or program modules may include an operating system, application programs, other program modules, and program data. The operating system may be or include a variety of operating systems such as Microsoft WINDOWS operating system, the Unix operating system, the Linux operating system, the Xenix operating system, the IBM AIX operating system, the Hewlett Packard UX operating system, the Novell NETWARE operating system, the Sun Microsystems SOLARIS operating system, the OS/2 operating system, the BeOS operating system, the MACINTOSH operating system, the APACHE operating system, an OPENSTEP operating system or another operating system of platform.

The CPU 1702 that executes commands and instructions may be a general-purpose processor, but may utilize any of a wide variety of other technologies including special-purpose hardware, a microcomputer, mini-computer, mainframe computer, programmed micro-processor, micro-controller, peripheral integrated circuit element, a CSIC (customer-specific integrated circuit), ASIC (application-specific integrated circuit), a logic circuit, a digital signal processor, a programmable logic device such as an FPGA (field-programmable gate array), PLD (programmable logic device), PLA (programmable logic array), smart chip, or any other device or arrangement of devices that is capable of implementing the steps of the processes of the invention.

The computing environment may also include other removable/nonremovable, volatile/nonvolatile computer storage media. For example, a hard disk drive may read or write to nonremovable, nonvolatile magnetic media. A magnetic disk drive may read from or writes to a removable, nonvolatile magnetic disk, and an optical disk drive may read from or write to a removable, nonvolatile optical disk such as a CD-ROM or other optical media. Other removable/nonremovable, volatile/nonvolatile computer storage media that can be used in the exemplary operating environment include, but are not limited to, magnetic tape cassettes, flash memory cards, digital versatile disks, digital video tape, solid state RAM, solid state ROM, and the like. The storage media are typically connected to the system bus through a removable or non-removable memory interface.

More generally, the computer shown in FIG. 17 is representative only and intended to provide one possible topology. It is possible to distribute the functionality illustrated in FIG. 17 among more or fewer computational entities as desired. The network 1716 may include a wired or wireless local-area network (LAN), wide-area network (WAN) and/or other types of networks. When used in a LAN networking environment, computers may be connected to the LAN through a network interface or adapter. When used in a WAN networking environment, computers typically include a modem or other communication mechanism. Modems may be internal or external, and may be connected to the system bus via the user-input interface, or other appropriate mechanism. Computers may be connected over the Internet, an Intranet, Extranet, Ethernet, or any other system that provides communications. Some suitable communications protocols may include TCP/IP, UDP, or OSI, for example. For wireless communications, communications protocols may include the cellular telecommunications infrastructure, WiFi or other 802.11 protocol, Bluetooth, Zigbee, IrDa or other suitable protocol. Furthermore, components of the system may communicate through a combination of wired or wireless paths.

Any suitable programming language may be used to implement without undue experimentation the analytical functions described within. Illustratively, the programming language used may include assembly language, Ada, APL, Basic, C, C++, C*, COBOL, dBase, Forth, FORTRAN, Java, Modula-2, Pascal, Prolog, Python, REXX, and/or JavaScript for example. Further, it is not necessary that a single type of instruction or programming language be utilized in conjunction with the operation of the system and method of the invention. Rather, any number of different programming languages may be utilized as is necessary or desirable.

The terms and expressions employed herein are used as terms and expressions of description and not of limitation, and there is no intention, in the use of such terms and expressions, of excluding any equivalents of the features shown and described or portions thereof. In addition, having described certain embodiments of the invention, it will be apparent to those of ordinary skill in the art that other embodiments incorporating the concepts disclosed herein may be used without departing from the spirit and scope of the invention. Accordingly, the described embodiments are to be considered in all respects as only illustrative and not restrictive.

What is claimed is:

1. An apparatus for accelerating data access and predicate evaluation, the apparatus comprising:
    a computer memory for storing (i) base data as a plurality of base columns, (ii) a plurality of sketched columns, each corresponding to a base column in the base data and having smaller code values compared thereto, and (iii) a compression map for mapping at least one base column to the corresponding sketched column; and
    a computer processor configured to:
        apply the compression map to a query having a predicate;
        determine data on the sketched column that satisfies the predicate; and
        evaluate the predicate based at least in part on the determined data on the sketched column without accessing the base column in the base data, wherein the computer processor is further configured to implement lossy compression for constructing the compression map and the base data comprises categorical data, the computer processor being further configured to encode the categorical data using lossy dictionary encoding.

2. The apparatus of claim 1, wherein the computer processor is further configured to:
determine at least one value whose appearance in the base column is above a predetermined threshold;
apply the compression map to assign a unique code to the at least one value; and
associate the unique code with the sketched column.

3. The apparatus of claim 2, wherein the compression map comprises at least one of an array of sorted values or a hash table having the unique code and a hash function.

4. The apparatus of claim 3, wherein the compression map comprises the array of sorted values when the compression map is order-preserving.

5. The apparatus of claim 3, wherein the compression map comprises the hash table when the compression map is non-order preserving.

6. The apparatus of claim 1, wherein the computer processor is further configured to:
construct a plurality of contiguous histogram buckets having an equi-depth histogram that approximates a common data format of the base data; and
create the sketched columns based at least in part on the histogram buckets.

7. The apparatus of claim 6, wherein the computer processor is further configured to construct the histogram buckets by sampling values uniformly from the base columns, generating a sorted list of the sampled values, and generating endpoints of each histogram bucket based on the sorted list.

8. The apparatus of claim 7, wherein the computer processor is further configured to (i) determine at least one frequent value based at least in part on a number of the endpoints and values in the base data and (ii) assign a unique code to the at least one frequent value.

9. The apparatus of claim 1, wherein the computer processor is further configured to:
assign a numerical code to each unique value in the base column; and
determine whether the numerical codes have appearance in the base column above a predetermined threshold, and, if not, collapse at least some of the numerical codes into a single code.

10. The apparatus of claim 1, wherein the sketched column has a fixed width.

11. A method of accelerating data access to a computer memory and predicate evaluation comprising:
storing, in the computer memory, (i) base data as a plurality of base columns, (ii) a plurality of sketched columns, each corresponding to a base column in the base data and having smaller code values compared thereto, and (iii) a compression map for mapping at least one base column to the corresponding sketched column, wherein the base data comprises categorical data;
implementing lossy compression for constructing the compression map;
encoding the categorical data using lossy dictionary encoding;
applying the compression map to a query having a predicate;
determining data on the sketched column that satisfies the predicate; and
evaluating the predicate based at least in part on the determined data on the sketched column without accessing the base column in the base data.

12. The method of claim 11, further comprising:
determining at least one value whose appearance in the base column is above a predetermined threshold;
applying the compression map to assign a unique code to the at least one value; and
associating the unique code with the sketched column.

13. The method of claim 12, wherein the compression map comprises at least one of an array of sorted values or a hash table having the unique code and a hash function.

14. The method of claim 13, wherein the compression map comprises the array of sorted values when the compression map is order-preserving.

15. The method of claim 13, wherein the compression map comprises the hash table when the compression map is non-order preserving.

16. The method of claim 11, further comprising:
constructing a plurality of contiguous histogram buckets having an equi-depth histogram that approximates a common data format of the base data; and
creating the sketched columns based at least in part on the histogram buckets.

17. The method of claim 11, wherein the histogram buckets is constructed by sampling values uniformly from the base columns, generating a sorted list of the sampled values, and generating endpoints of each histogram bucket based on the sorted list.

18. The method of claim 17, further comprising:
determining at least one frequent value based at least in part on a number of the endpoints and values in the base data; and
assigning a unique code to the at least one frequent value.

19. The method of claim 11, further comprising:
assigning a numerical code to each unique value in the base column; and
determining whether the numerical codes have appearance in the base column above a predetermined threshold, and, if not, collapse at least some of the numerical codes into a single code.

20. The method of claim 11, wherein the sketched column has a fixed width.

* * * * *

UNITED STATES PATENT AND TRADEMARK OFFICE
CERTIFICATE OF CORRECTION

PATENT NO. : 11,397,712 B2
APPLICATION NO. : 17/051797
DATED : July 26, 2022
INVENTOR(S) : Stratos Idreos et al.

Page 1 of 1

It is certified that error appears in the above-identified patent and that said Letters Patent is hereby corrected as shown below:

In the Specification

Column 1 Line 12 Please insert the following:
--STATEMENT REGARDING FEDERALLY SPONSORED RESEARCH OR DEVELOPMENT
This invention was made with government support under 1452595 awarded by the National Science Foundation (NSF). The government has certain rights in this invention.--

Signed and Sealed this
Thirteenth Day of September, 2022

Katherine Kelly Vidal
*Director of the United States Patent and Trademark Office*